(12) United States Patent
Huang

(10) Patent No.: US 12,381,157 B2
(45) Date of Patent: Aug. 5, 2025

(54) SEMICONDUCTOR DEVICE WITH AN INSULATIVE DECOUPLING UNIT POSITIONED BETWEEN TWO OF A PLURALITY OF CONDUCTIVE FEATURES

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 716 days.

(21) Appl. No.: 17/685,865

(22) Filed: Mar. 3, 2022

(65) Prior Publication Data

US 2023/0282593 A1    Sep. 7, 2023

(51) Int. Cl.
*H01L 23/544* (2006.01)
*H01L 21/768* (2006.01)
(Continued)

(52) U.S. Cl.
CPC ...... *H01L 23/544* (2013.01); *H01L 21/76802* (2013.01); *H01L 21/76837* (2013.01);
(Continued)

(58) Field of Classification Search
CPC ............. H01L 23/544; H01L 21/76802; H01L 21/76837; H01L 23/5226; H01L 21/76885;
(Continued)

(56) References Cited

U.S. PATENT DOCUMENTS

| 5,728,473 A | 3/1998 | Inoue et al. |
| 6,277,745 B1 * | 8/2001 | Liu ............... H01L 21/76841 438/653 |

(Continued)

FOREIGN PATENT DOCUMENTS

| JP | S62194638 A | 8/1987 |
| JP | 2021103225 A | 7/2021 |

(Continued)

OTHER PUBLICATIONS

Taiwanese Office Action dated May 17, 2023 in application No. 111118389, the search report attached to the Office Action; pp. 1-5.

*Primary Examiner* — William B Partridge
*Assistant Examiner* — Erik A. Anderson
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a first tier structure positioned on a substrate and including: a plurality of conductive features of the first tier structure positioned over the substrate, and a decoupling unit of the first tier structure positioned between the plurality of conductive features of the first tier structure, and including a bottle-shaped cross-sectional profile; a first set of solid alignment marks including: a first-tier-alignment mark of the first set of solid alignment marks positioned on the decoupling unit of the first tier structure; a first set of spaced alignment marks including: a first-tier-alignment mark of the first set of spaced alignment marks positioned in a mirror manner of the first-tier-alignment mark of the first set of solid alignment marks according to a first axis of symmetry.

12 Claims, 24 Drawing Sheets

(51) Int. Cl.
*H01L 23/522* (2006.01)
*H01L 23/532* (2006.01)

(52) U.S. Cl.
CPC .... *H01L 23/5226* (2013.01); *H01L 21/76885* (2013.01); *H01L 23/53295* (2013.01); *H01L 2223/54426* (2013.01)

(58) Field of Classification Search
CPC ..... H01L 23/53295; H01L 2223/54426; H01L 21/76835; H01L 2223/54486; H01L 21/7682; H01L 23/5283
See application file for complete search history.

(56) References Cited

U.S. PATENT DOCUMENTS

| | | | |
|---|---|---|---|
| 6,482,755 B1* | 11/2002 | Ngo | H01L 21/3212 |
| | | | 257/E21.582 |
| 8,653,626 B2 | 2/2014 | Lo et al. | |
| 11,862,599 B2 | 1/2024 | Chen et al. | |
| 11,908,836 B2* | 2/2024 | Chen | H01L 21/565 |
| 2004/0051872 A1 | 3/2004 | Blidegn | |
| 2006/0017180 A1* | 1/2006 | Sarma | H01L 23/544 |
| | | | 257/E23.179 |
| 2006/0103033 A1 | 5/2006 | Van Haren et al. | |
| 2007/0264213 A1 | 11/2007 | Han et al. | |
| 2008/0157260 A1* | 7/2008 | Fried | H01J 37/3174 |
| | | | 257/E23.179 |
| 2011/0233785 A1* | 9/2011 | Koester | H01L 21/76898 |
| | | | 257/E21.585 |
| 2012/0229807 A1 | 9/2012 | Huang et al. | |
| 2014/0083747 A1* | 3/2014 | Matsuno | H01L 23/544 |
| | | | 174/251 |
| 2017/0125341 A1* | 5/2017 | Lin | H01L 21/76898 |
| 2017/0170129 A1 | 6/2017 | Cai et al. | |
| 2017/0213796 A1* | 7/2017 | Fischer | G01N 21/956 |
| 2019/0148123 A1 | 5/2019 | Lee et al. | |
| 2019/0302495 A1* | 10/2019 | Taniike | G02F 1/1337 |
| 2019/0333862 A1 | 10/2019 | Wang et al. | |
| 2021/0057334 A1* | 2/2021 | Tien | H01L 21/76877 |
| 2021/0125936 A1* | 4/2021 | Wang | H01L 21/6835 |
| 2021/0375781 A1* | 12/2021 | Lin | G03F 1/42 |
| 2022/0051951 A1* | 2/2022 | Devilliers | G06T 7/74 |
| 2022/0310554 A1* | 9/2022 | Chen | H01L 23/544 |
| 2022/0375871 A1* | 11/2022 | Singh | H01L 23/544 |

FOREIGN PATENT DOCUMENTS

| | | |
|---|---|---|
| TW | 200705135 A | 2/2007 |
| TW | 200712799 A | 4/2007 |
| TW | 201027283 A | 7/2010 |
| TW | 201407741 A | 2/2014 |
| TW | 201929227 A | 7/2019 |
| TW | 202021088 A | 6/2020 |
| TW | 202113997 A | 4/2021 |
| TW | 202114108 A | 4/2021 |

\* cited by examiner

SEMICONDUCTOR DEVICE WITH AN INSULATIVE DECOUPLING UNIT POSITIONED BETWEEN TWO OF A PLURALITY OF CONDUCTIVE FEATURES

TECHNICAL FIELD

The present disclosure relates to a semiconductor device and a method for fabricating the semiconductor device, and more particularly, to a semiconductor device with a decoupling unit and a method for fabricating the semiconductor device with the decoupling unit.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first tier structure including a plurality of conductive features of the first tier structure positioned over a substrate, and a decoupling unit of the first tier structure positioned between the plurality of conductive features of the first tier structure; a first set of solid alignment marks including a first-tier-alignment mark positioned on the decoupling unit of the first tier structure, and including a fluorescent material; a second tier structure positioned on the first tier structure and including a plurality of conductive features of the second tier structure positioned over and deviated from the plurality of conductive features of the first tier structure, and a decoupling unit of the second tier structure positioned over the first tier structure, and positioned between the plurality of conductive features of the second tier structure; and a first set of spaced alignment marks including a second-tier-alignment mark positioned on the decoupling unit of the second tier structure, and including a fluorescent material. The decoupling units of the first tier structure and the second tier structure include a low-k dielectric material and respectively include a bottle-shaped cross-sectional profile.

Another aspect of the present disclosure provides a semiconductor device including a first tier structure positioned on a substrate and including: a plurality of conductive features of the first tier structure positioned over the substrate, and a decoupling unit of the first tier structure positioned between the plurality of conductive features of the first tier structure, and including a bottle-shaped cross-sectional profile; a first set of solid alignment marks including: a first-tier-alignment mark of the first set of solid alignment marks positioned on the decoupling unit of the first tier structure; a first set of spaced alignment marks including: a first-tier-alignment mark of the first set of spaced alignment marks positioned in a mirror manner of the first-tier-alignment mark of the first set of solid alignment marks according to a first axis of symmetry. The first-tier-alignment mark of the first set of solid alignment marks and the first-tier-alignment mark of the first set of spaced alignment marks include a fluorescent material. The decoupling unit of the first tier structure includes a low-k dielectric material.

Another aspect of the present disclosure provides a method for fabricating a semiconductor device including forming a first tier structure over a substrate and including: a plurality of conductive features over the substrate, and a decoupling unit between the plurality of conductive features; forming a first set of solid alignment marks including a first-tier-alignment mark on the decoupling unit of the first tier structure; forming a second tier structure over the first tier structure and including: a plurality of conductive features over the first tier structure, and a decoupling unit between the plurality of conductive features; and forming a first set of spaced alignment marks including a second-tier-alignment mark on the decoupling unit of the second tier structure. The first-tier-alignment mark and the second-tier-alignment mark includes a fluorescent material. The decoupling units of the first tier structure and the second tier structure include a low-k dielectric material.

Due to the design of the semiconductor device of the present disclosure, the first-tier-alignment marks, the second-tier-alignment marks, the third-tier-alignment marks, and the fourth-tier-alignment marks including the fluorescent material may improve optical recognition during the wafer fabrication process. As a result, the yield of fabricating the semiconductor device may be improved. In addition, the decoupling units may reduce parasitic capacitance of the plurality of conductive features.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
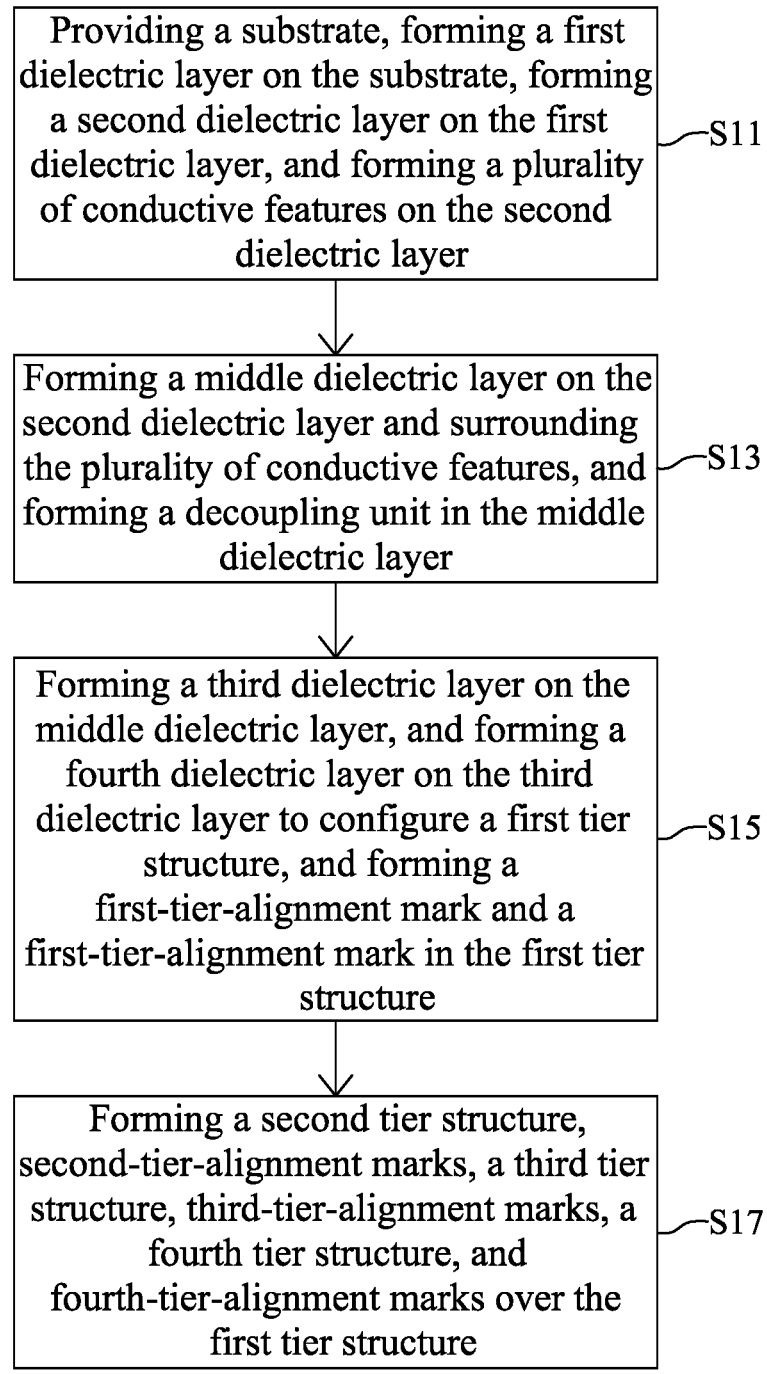
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 12:
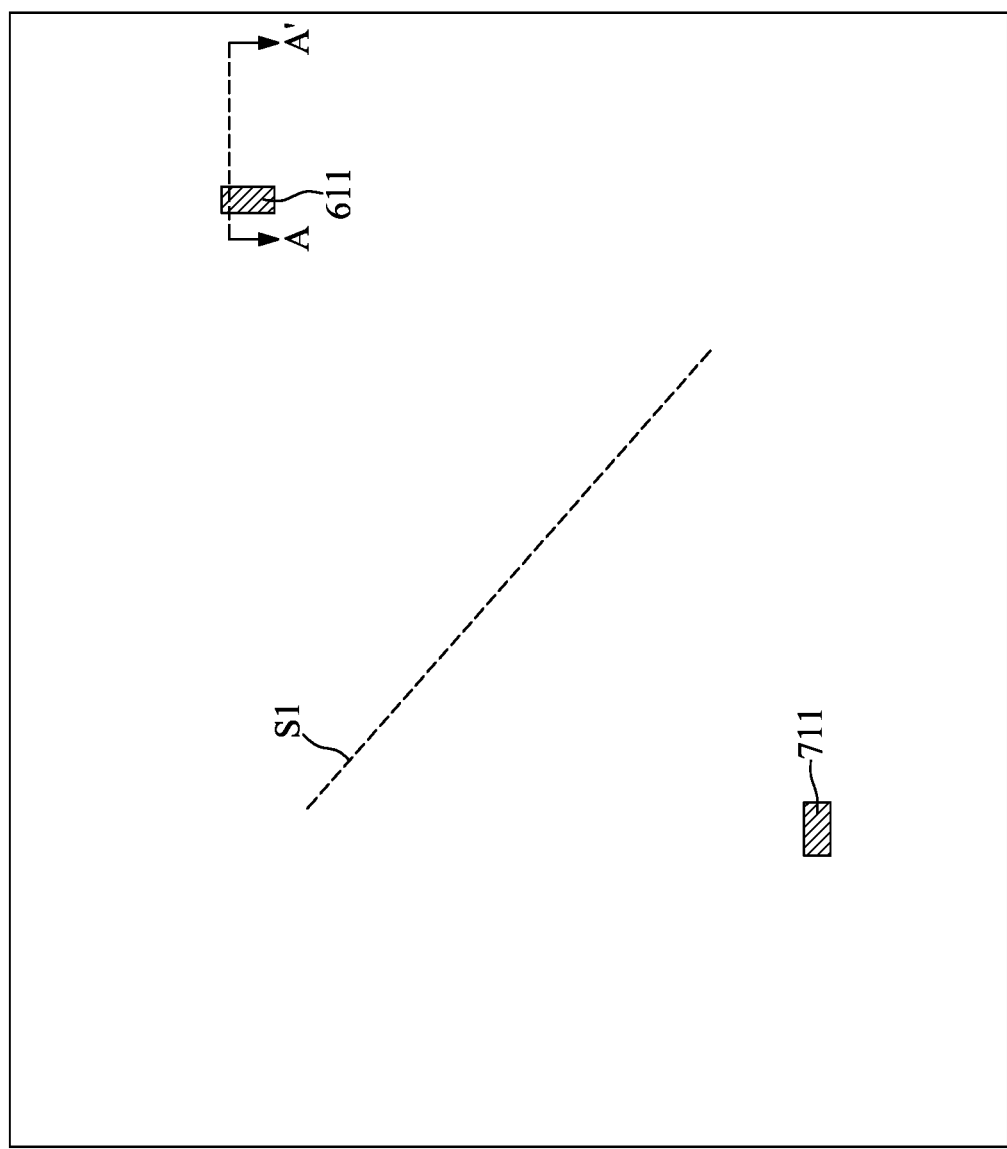
FIG. 12 illustrates, in a schematic top-view diagram, an intermediate semiconductor device in accordance with one embodiment of the present disclosure.
Figure 13:
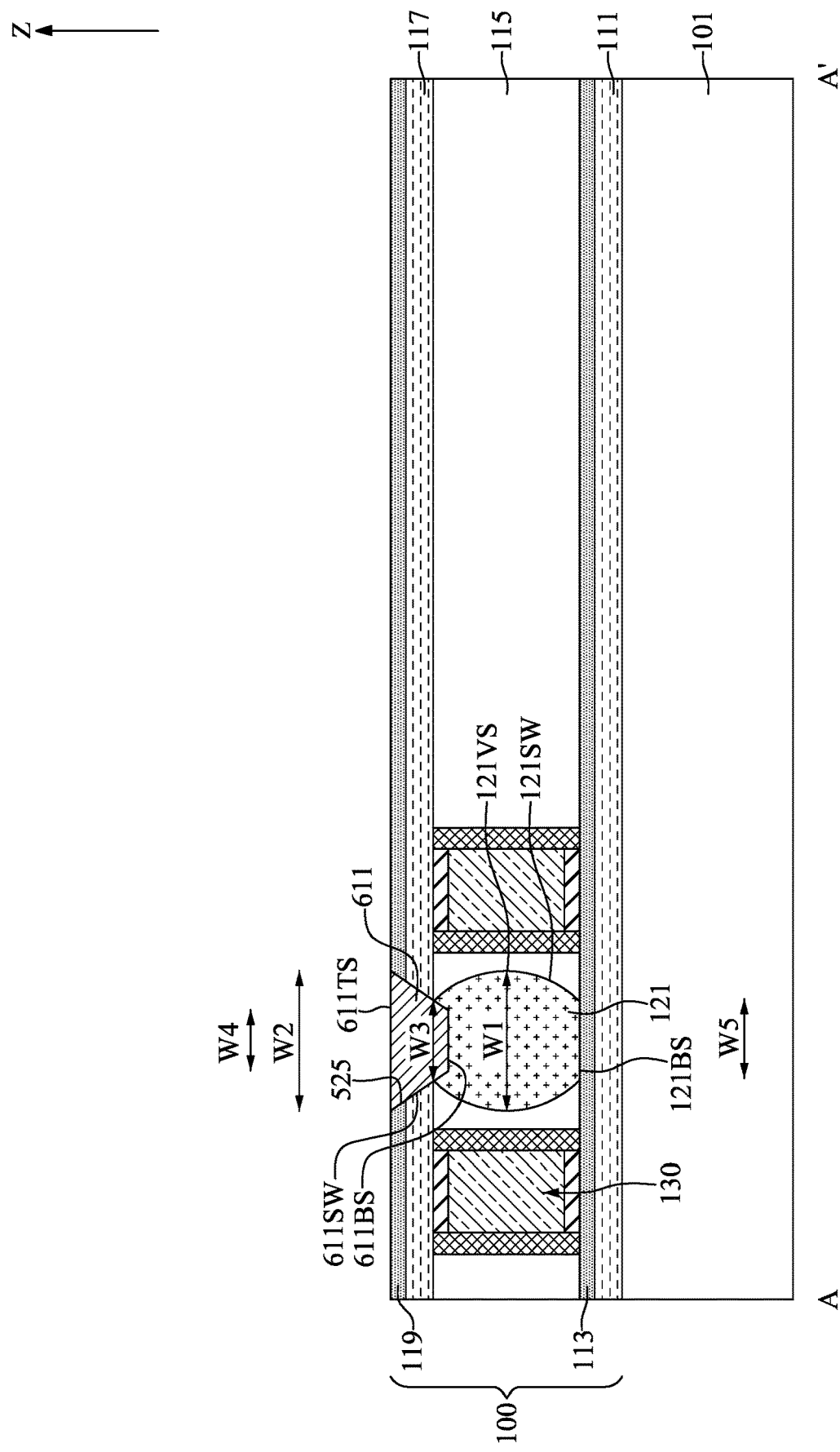
FIG. 13 is a schematic cross-sectional view diagram taken along a line A-A' in FIG. 12 illustrating part of the flow for fabricating the semiconductor device in accordance with one embodiment of the present disclosure.

FIG. 1 illustrates, in a flowchart diagram form, a method 10 for fabricating a semiconductor device 1A in accordance with one embodiment of the present disclosure. FIGS. 2 to 11 illustrate, in schematic cross-sectional view diagrams, part of a flow for fabricating the semiconductor device 1A in accordance with one embodiment of the present disclosure. FIG. 12 illustrates, in a schematic top-view diagram, an intermediate semiconductor device 1A in accordance with one embodiment of the present disclosure. FIG. 13 is a schematic cross-sectional view diagram taken along a line A-A' in FIG. 12 illustrating part of the flow for fabricating the semiconductor device 1A in accordance with one embodiment of the present disclosure.

With reference to FIGS. 1 to 5, at step S11, a substrate 101 may be provided, a first dielectric layer 111 may be formed on the substrate 101, a second dielectric layer 113 may be formed on the first dielectric layer 111, and a plurality of conductive features 130 may be formed on the second dielectric layer 113.

Figure 2:
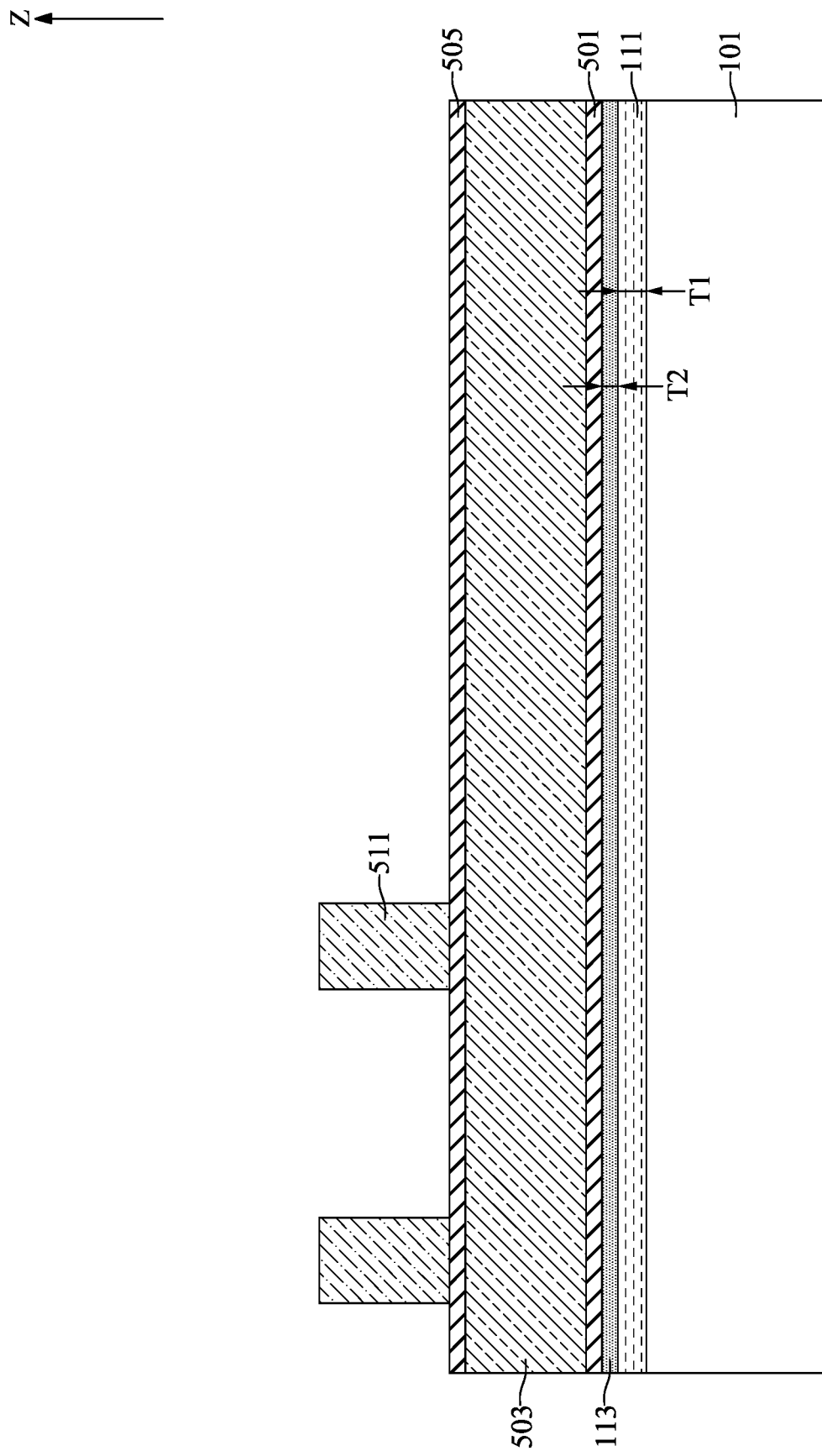
FIGS. 2 to 11 illustrate, in schematic cross-sectional view diagrams, part of a flow for fabricating the semiconductor device in accordance with one embodiment of the present disclosure.

With reference to FIG. 2, the substrate 101 may include a bulk semiconductor substrate that is composed entirely of at least one semiconductor material, a plurality of device elements (not show for clarity), a plurality of dielectric layers (not shown for clarity), and a plurality of conductive features (not show for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

With reference to FIG. 2, the plurality of device elements may be formed on the bulk semiconductor substrate or the topmost semiconductor material layer. Some portions of the plurality of device elements may be formed in the bulk semiconductor substrate or the topmost semiconductor material layer. The plurality of device elements may be transistors such as complementary metal-oxide-semiconductor transistors, metal-oxide-semiconductor field-effect transistors, fin field-effect-transistors, the like, or a combination thereof.

With reference to FIG. 2, the plurality of dielectric layers may be formed on the bulk semiconductor substrate or the topmost semiconductor material layer and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

With reference to FIG. 2, the plurality of conductive features may include interconnect layers and conductive vias. The interconnect layers may be separated from each other and may be horizontally disposed in the plurality of dielectric layers along the direction Z. The conductive vias may connect adjacent interconnect layers along the direction Z, and adjacent device element and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive features may together configure functional units in the substrate 101. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

With reference to FIG. 2, in some embodiments, the first dielectric layer 111 may be formed of, for example, fluorosilicate glass, borophosphosilicate glass, a spin-on low-k dielectric layer, a chemical vapor deposition low-k dielectric layer, or a combination thereof. In some embodiments, the first dielectric layer 111 may include a self-planarizing material such as a spin-on glass or a spin-on low-k dielectric material such as SiLK™. The use of a self-planarizing dielectric material may avoid the need to perform a subsequent planarizing step. In some embodiments, the first dielectric layer 111 may be formed by a deposition process including, for example, chemical vapor deposition, plasma enhanced chemical vapor deposition, evaporation, or spin-on coating.

With reference to FIG. 2, in some embodiments, the second dielectric layer 113 may be, for example, silicon nitride, silicon oxide nitride, silicon oxynitride, the like, or a combination thereof. The second dielectric layer 113 may be formed by, for example, chemical vapor deposition, plasma enhanced chemical vapor deposition, or other applicable deposition process. In some embodiments, the second dielectric layer 113 may serve as a barrier layer to prevent moisture entering the underlying layers (e.g., the first dielectric layer 111 and the substrate 101). In some embodiments, the thickness T1 of the first dielectric layer 111 is greater than the thickness T2 of the second dielectric layer 113.

With reference to FIG. 2, a layer of first material 501 may be formed on the second dielectric layer 113. The first material 501 may be, for example, titanium, titanium nitride, tantalum, tantalum nitride, or the like. The layer of first material 501 may be formed by, for example, chemical vapor deposition, physical vapor deposition, sputtering, or the like. A layer of second material 503 may be formed on the layer of first material 501. The second material 503 may be, for example, copper, a copper alloy, silver, gold, tungsten, aluminum, nickel, or the like. The layer of second material 503 may be formed by, for example, physical vapor deposition, sputtering, or the like. A layer of third material 505 may be formed on the layer of second material 503. In some embodiments, the third material 505 and the first material 501 may include the same material. In some embodiments, the third material 505 may be, for example, titanium, titanium nitride, tantalum, tantalum nitride, or the like. The third material 505 may be formed by, for example, chemical vapor deposition, physical vapor deposition, sputtering, or the like.

With reference to FIG. 2, a first mask layer 511 may be formed on the layer of third material 505. The first mask layer 511 may be a photoresist layer and may include the pattern of the plurality of conductive features 130.

Figure 3:
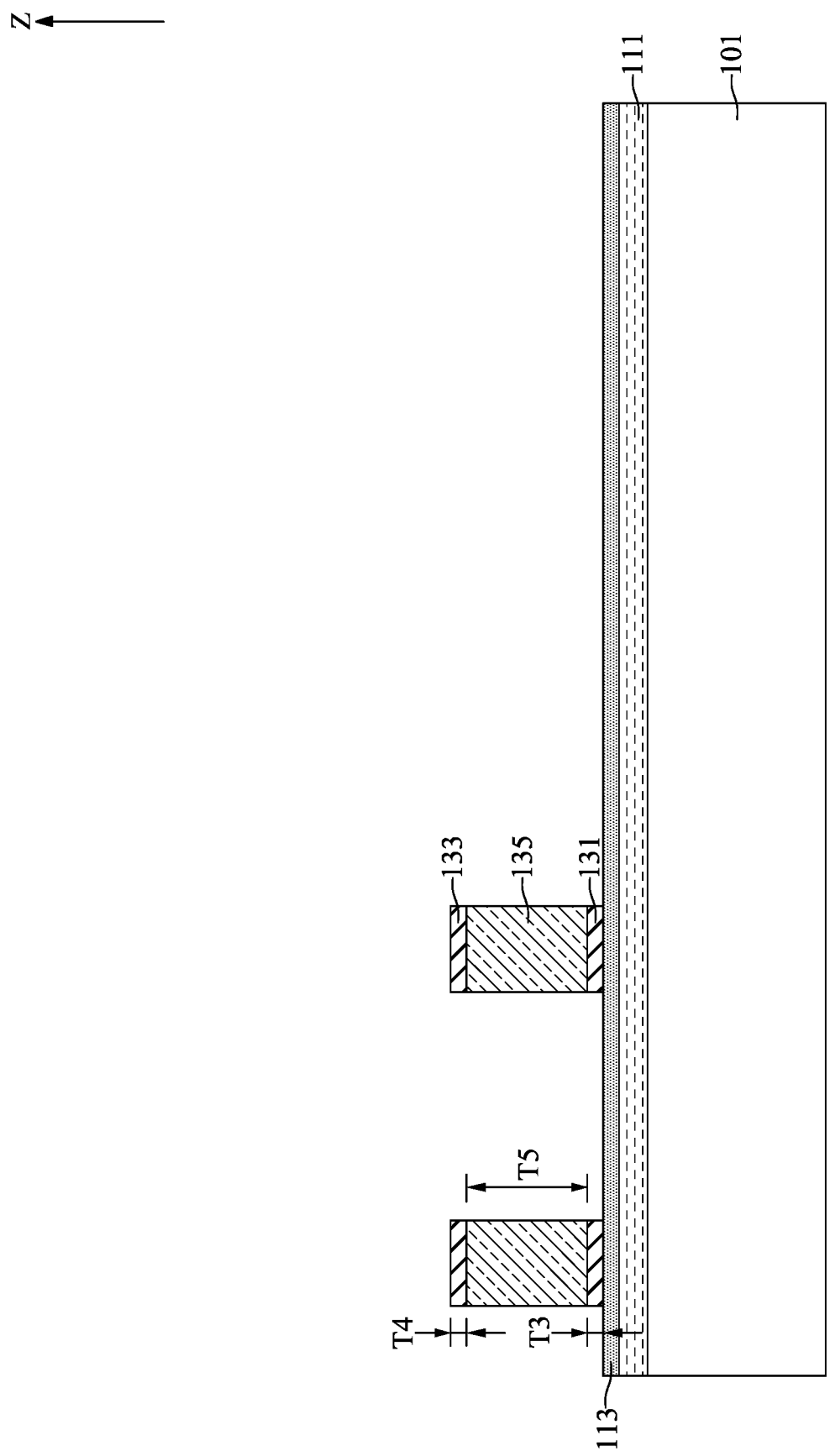

With reference to FIG. 3, an etch process, such as an anisotropic dry etch process, may be performed to remove portions of the first material 501, the second material 503, and the third material 505. After the etch process, the remaining first material 501 may be referred to as a plurality of bottom barrier layers 131, the remaining second material 503 may be referred to as a plurality of middle conductive layers 135, and the remaining third material 505 may be referred to as a plurality of top barrier layers 133. In some embodiments, the etch process may be a multi-step etch process and may be anisotropic.

For brevity, clarity, and convenience of description, only one bottom barrier layer 131, one middle conductive layer 135, and one top barrier layer 133 are described. In some embodiments, the thickness T3 of the bottom barrier layer 131 and the thickness T4 of the top barrier layer 133 may be about the same. In some embodiments, the thickness T3 of the bottom barrier layer 131 may be greater than the thickness T4 of the top barrier layer 133. In some embodiments, the thickness T5 of the middle conductive layer 135 may be greater than the thickness T3 of the bottom barrier layer 131 or the thickness T4 of the top barrier layer 133.

Figure 4:
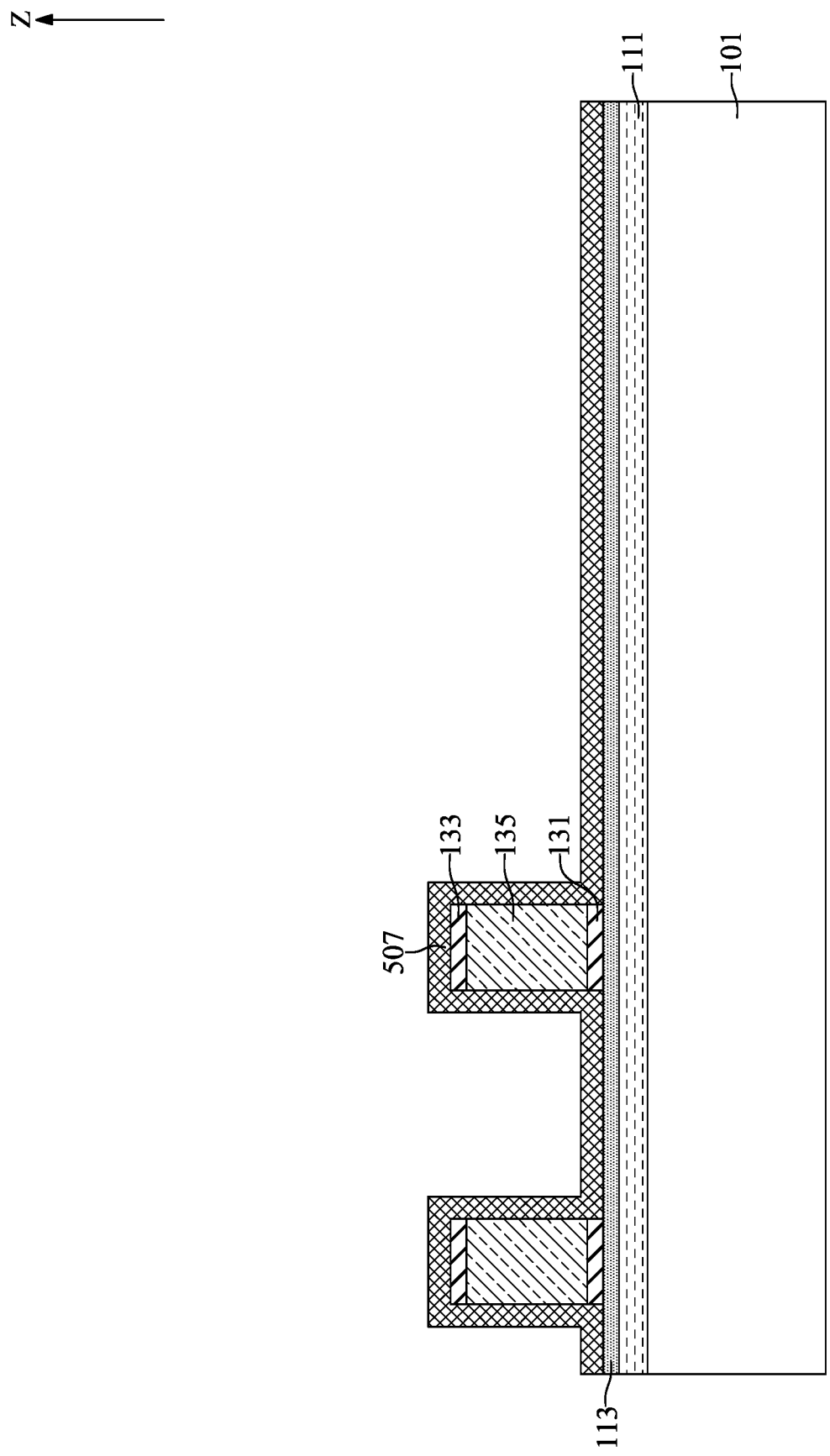

With reference to FIG. 4, a layer of fourth material 507 may be conformally formed over the intermediate semiconductor device illustrated in FIG. 3. The fourth material 507 may be, for example, titanium, titanium nitride, tantalum, tantalum nitride, or the like. The layer of fourth material 507 may be formed by, for example, atomic layer deposition, chemical vapor deposition, physical vapor deposition, sputtering, or the like. In some embodiments, the fourth material 507 and the top barrier layer 133 may include the same material.

Figure 5:
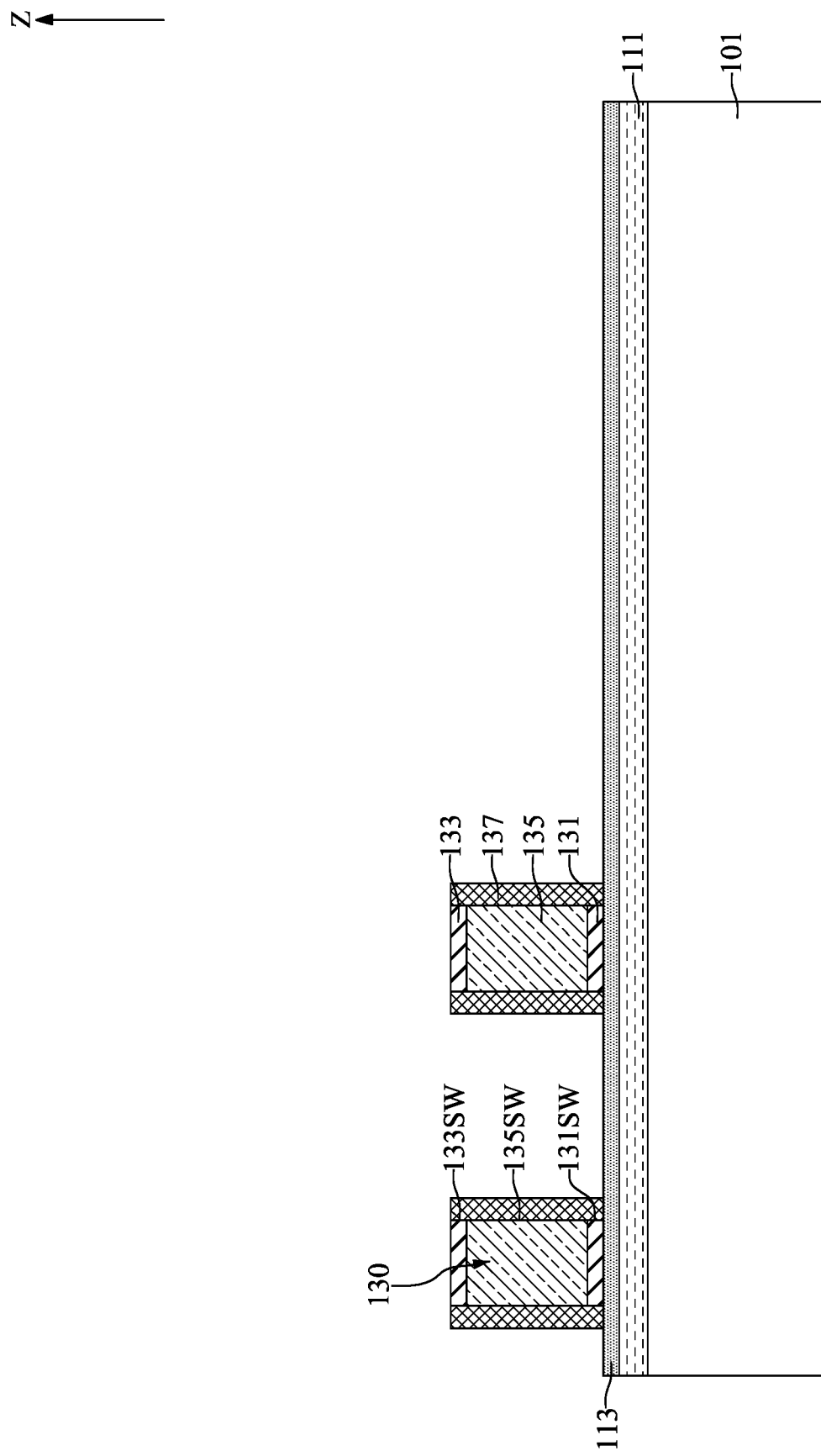

With reference to FIG. 5, an etch process, such as an anisotropic dry etch process, may be performed to remove portions of the fourth material 507. After the etch process, the remaining fourth material 507 may be referred to as a plurality of spacer barriers 137. The plurality of spacer barriers 137 may be formed to cover the sidewalls 133SW of the top barrier layers 133, the sidewalls 135SW of the middle conductive layers 135, and the sidewalls 131SW of the bottom barrier layer 131.

The plurality of spacer barriers 137, the plurality of top barrier layers 133, the plurality of middle conductive layers 135, and the plurality of bottom barrier layers 131 together configure the plurality of conductive features 130.

With reference to FIG. 1 and FIGS. 6 to 9, at step S13, a middle dielectric layer 115 may be formed on the second dielectric layer 113 and surrounding the plurality of conductive features 130, and a decoupling unit 121 may be formed in the middle dielectric layer 115.

Figure 6:
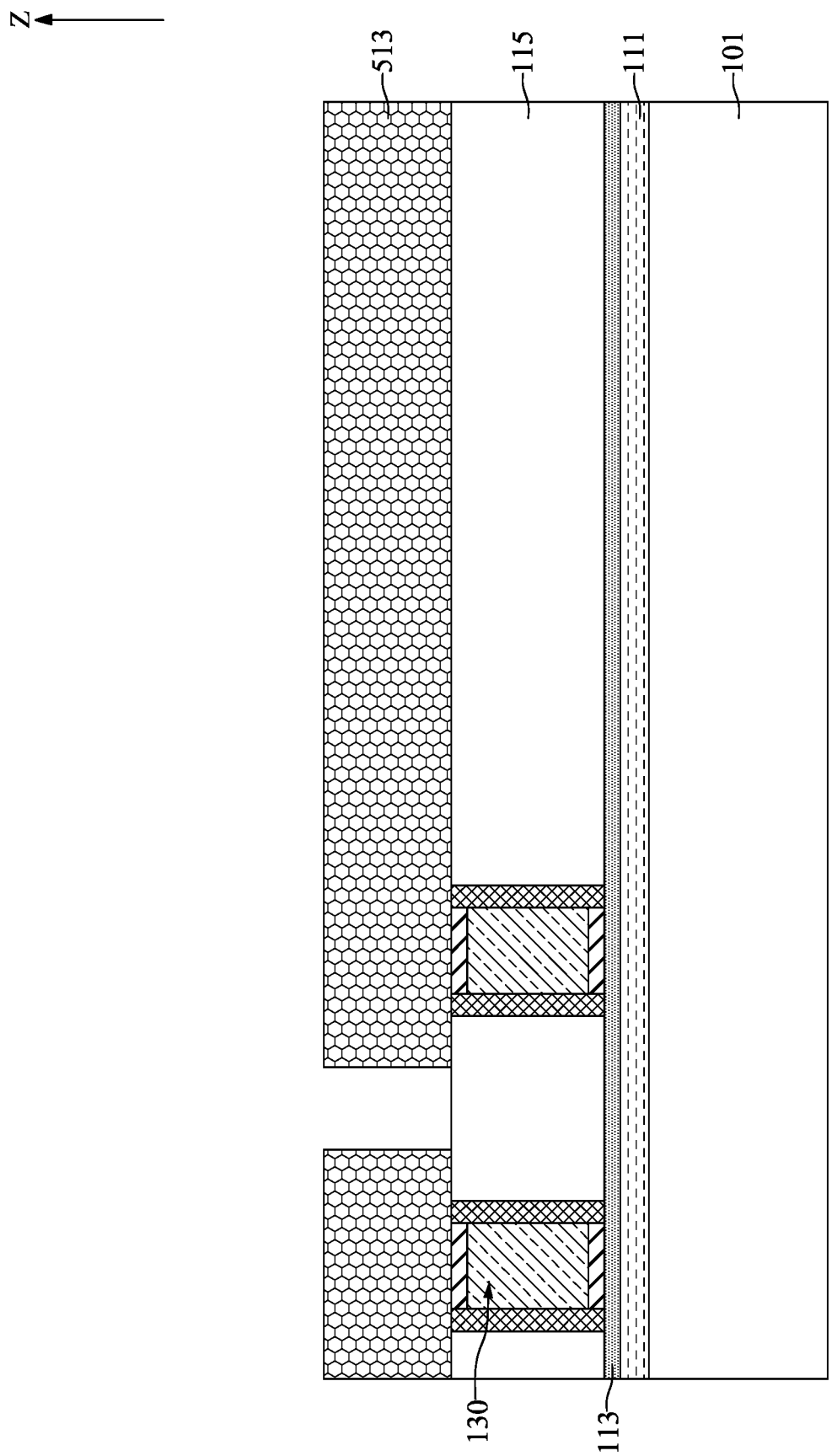

With reference to FIG. 6, the middle dielectric layer 115 may be formed on the second dielectric layer 113 and cover the plurality of conductive features 130. A planarization process, such as chemical mechanical polishing, may be performed until the top surfaces of the plurality of conductive features 130 are exposed to remove excess material and provide a substantially flat surface for subsequent processing steps. In some embodiments, the middle dielectric layer 115 may be formed of a material having different etching rate with respect to the second dielectric layer 113. In some embodiments, the middle dielectric layer 115 may be formed of, for example, silicon oxide, silicon nitride, silicon oxynitride, silicon nitride oxide, fluorosilicate glass, borophosphosilicate glass, or a combination thereof. In some embodiments, the middle dielectric layer 115 may be formed by, for example, chemical vapor deposition, plasma enhanced chemical vapor deposition, or other applicable deposition process.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

With reference to FIG. 6, a second mask layer 513 may be formed on the middle dielectric layer 115. In some embodiments, the middle dielectric layer 115 may be a photoresist layer and may include the pattern of the decoupling unit 121.

Figure 7:
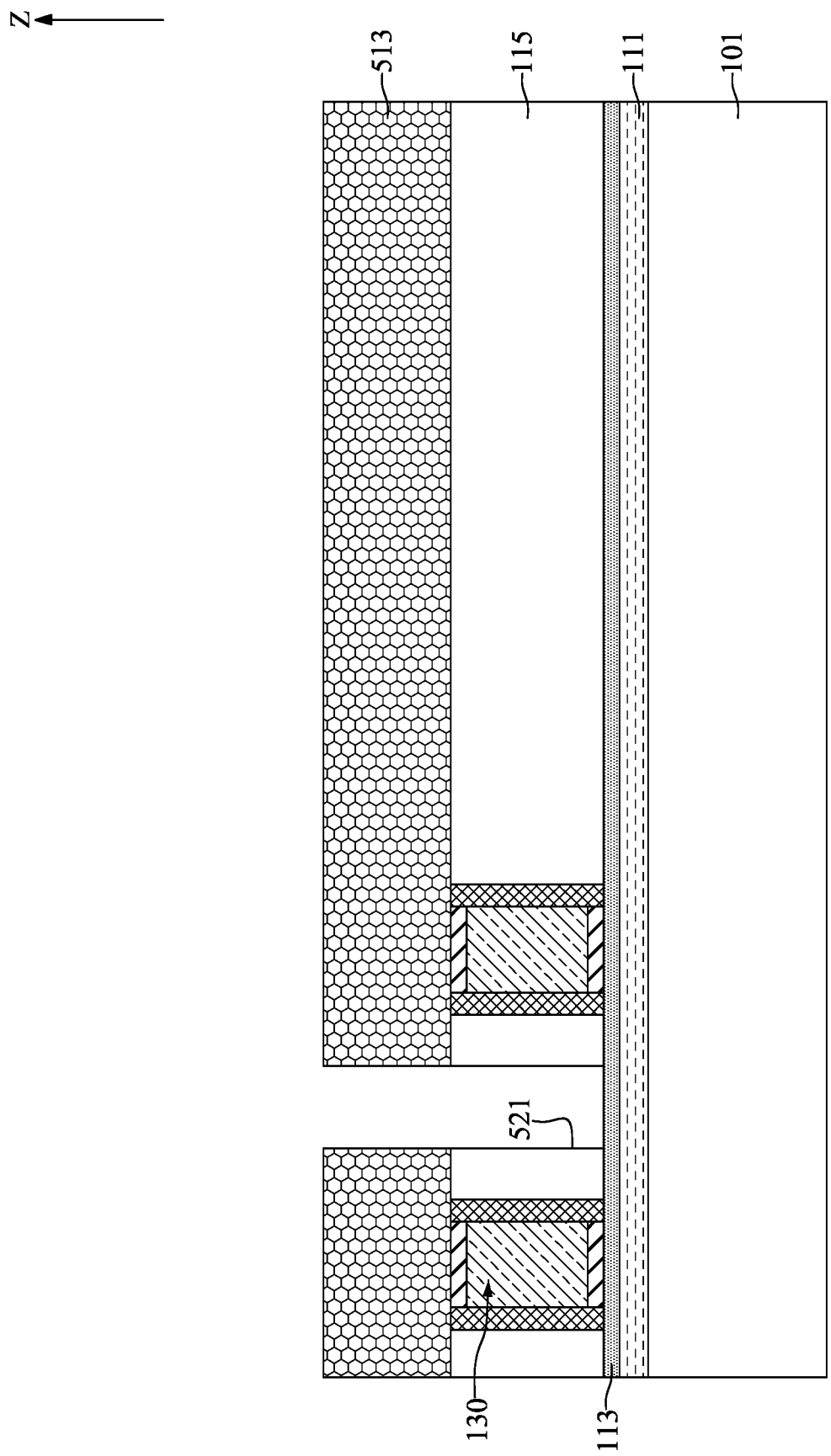

With reference to FIG. 7, an anisotropic etch process may be performed to remove portions of the middle dielectric layer 115 and concurrently form an opening 521. In some embodiments, the anisotropic etch process may be an anisotropic dry etching process. In some embodiments, the etch rate ratio of the middle dielectric layer 115 to the second dielectric layer 113 may be between about 100:1 and about 1.05:1, between about 15:1 and about 2:1, or between about 10:1 and about 2:1 during the anisotropic etch process.

Figure 8:
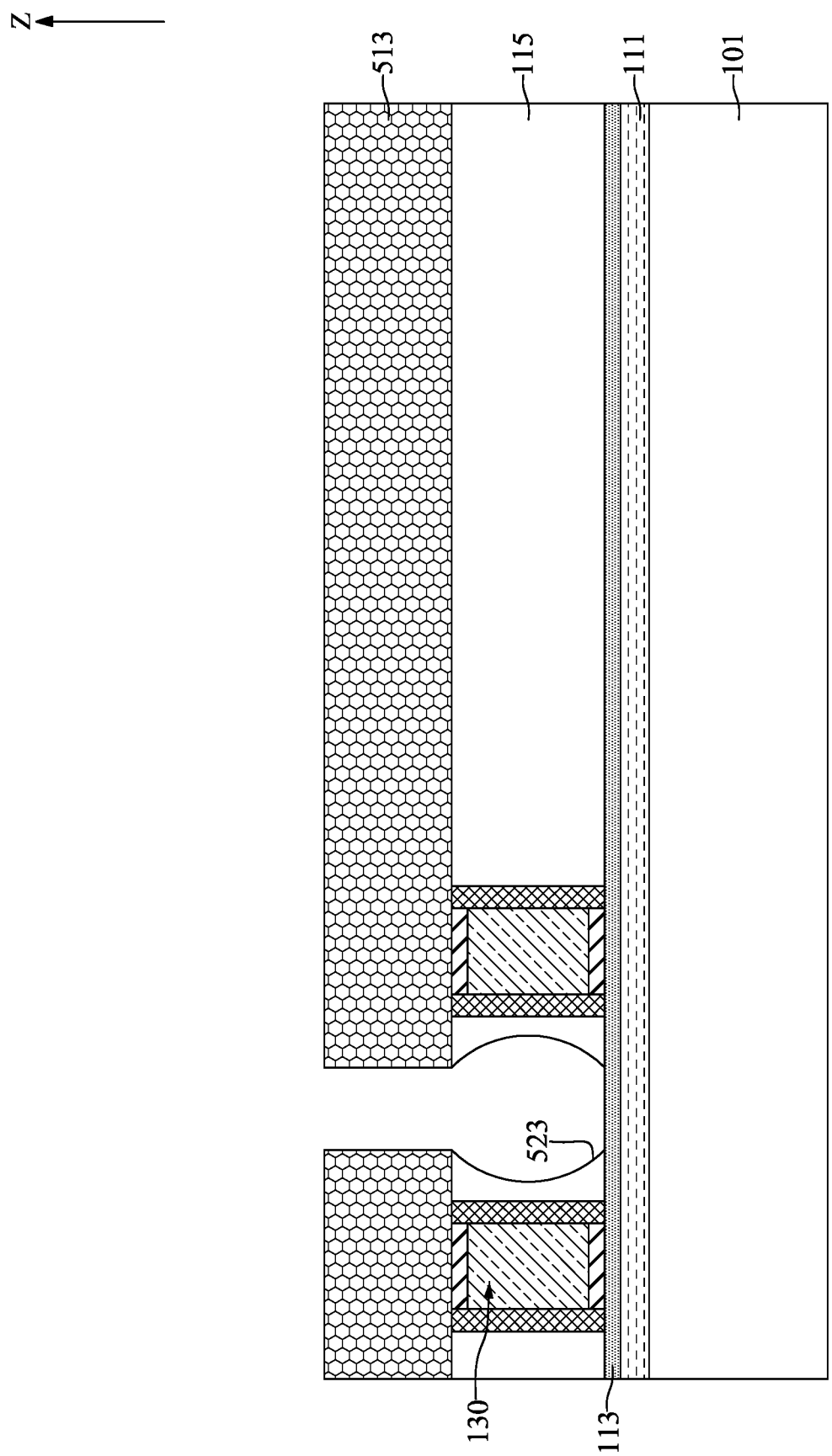

With reference to FIG. 8, an expansion etch process may be performed to expand the opening 521 into an expanded opening 523. In some embodiments, the expansion etch process may be an isotropic etch process. In some embodiments, the expansion etch process may be a wet etch process. In some embodiments, the etch rate ratio of the middle dielectric layer 115 to the second dielectric layer 113 may be between about 100:1 and about 1.05:1, between about 15:1 and about 2:1, or between about 10:1 and about 2:1 during the expansion etch process. In some embodiments, the sidewall of the expanded opening 523 may be curved.

Figure 9:
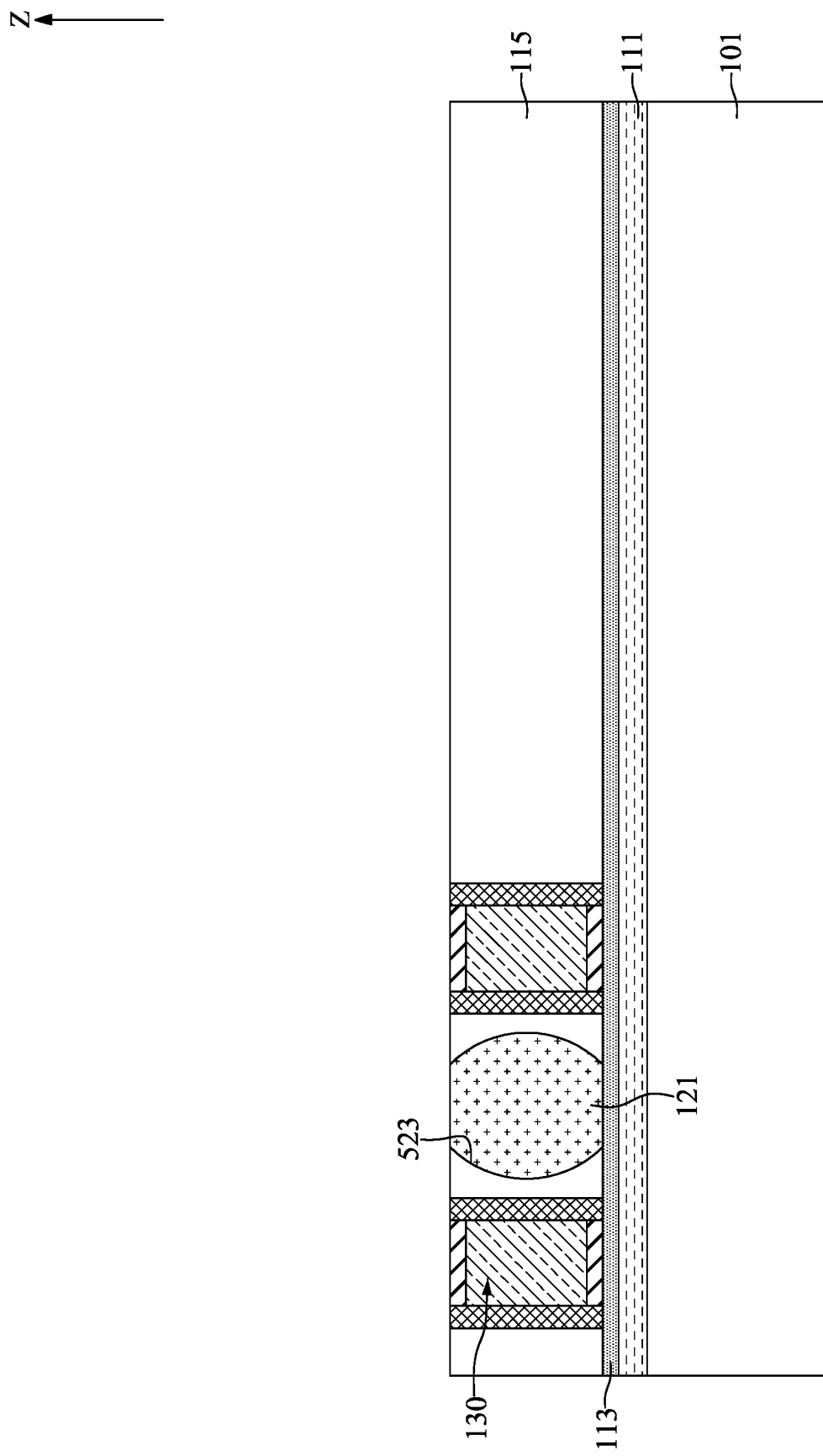

With reference to FIG. 9, the second mask layer 513 may be removed, an insulating material may be deposited to completely fill the expanded opening 523, and a planarization process, such as chemical mechanical polishing, may be subsequently performed until the top surfaces of the plurality of conductive features 130 are exposed to remove excess material, provide a substantially flat surface for subsequent processing steps, and concurrently form the decoupling unit 121. In some embodiments, the decoupling unit 121 may have a bottle-shaped cross-sectional profile. In some embodiments, the insulating material to be formed the decoupling unit 121 may be, for example, a porous low-k material.

In some embodiments, the insulating material to be formed the decoupling unit 121 may be an energy-removable material. The energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source. The base material may include a methylsilsesquioxane based material. The decomposable porogen material may include a porogen organic compound that provides porosity to the base material of the energy-removable material. An energy treatment may be performed after the planarization process by applying an energy source. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the energy-removable material to generate empty spaces (pores), with the base material remaining in place. The empty spaces (pores) may reduce the dielectric constant of the decoupling unit 121.

With reference to FIG. 9, the decoupling unit 121 may be formed between the plurality of conductive features 130. In some embodiments, the decoupling unit 121 having low dielectric constant may implement a decoupling function. In some embodiments, the decoupling unit 121 may reduce parasitic capacitance of the plurality of conductive features 130.

With reference to FIG. 1 and FIGS. 10 to 13, at step S15, a third dielectric layer 117 may be formed on the middle dielectric layer 115, and a fourth dielectric layer 119 may be formed on the third dielectric layer 117 to configure a first tier structure 100, and a first-tier-alignment mark 611 and a first-tier-alignment mark 711 may be formed in the first tier structure 100.

Figure 10:
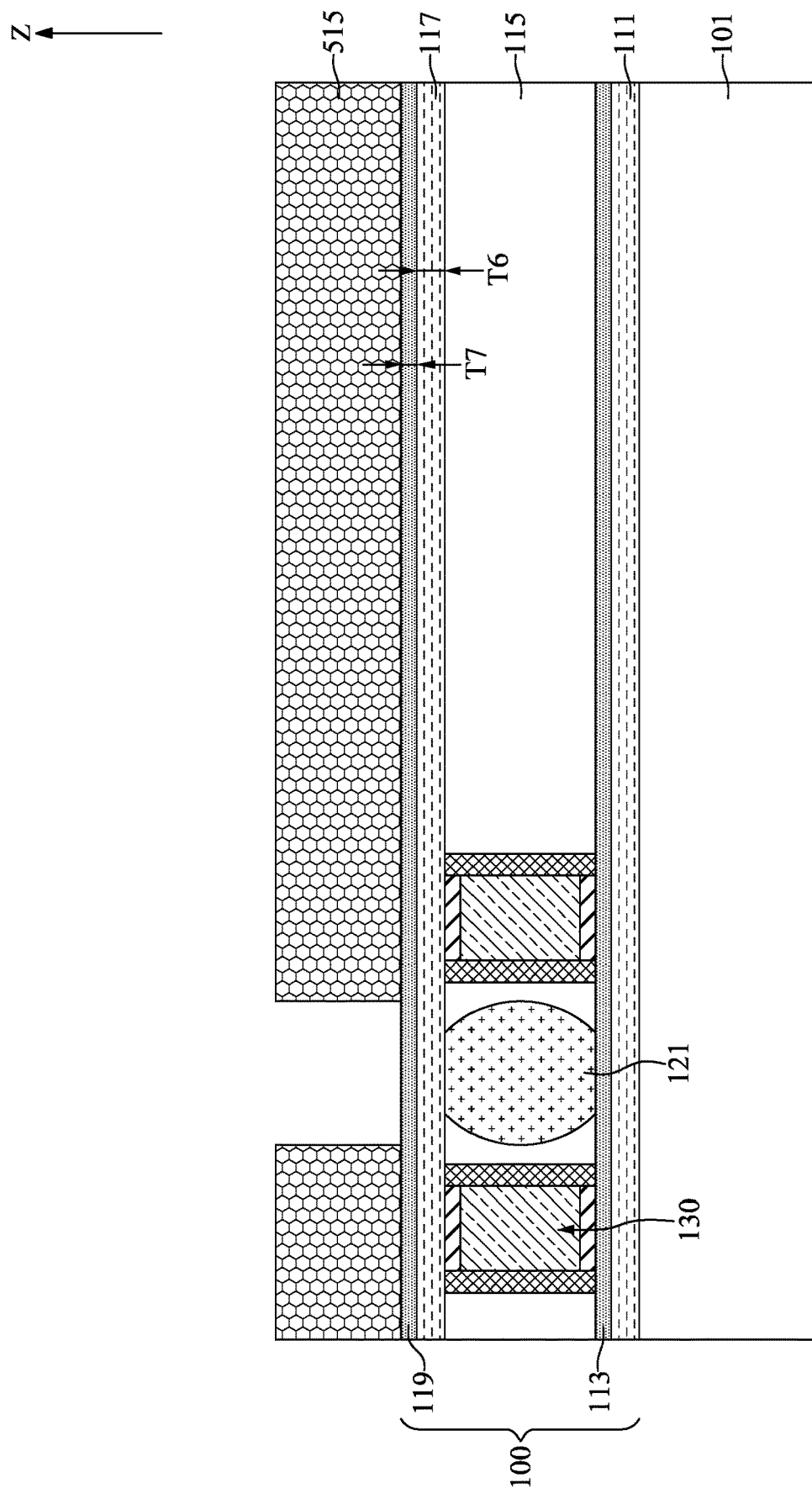

With reference to FIG. 10, in some embodiments, the third dielectric layer 117 may be formed of, for example, fluorosilicate glass, borophosphosilicate glass, a spin-on low-k dielectric layer, a chemical vapor deposition low-k dielectric layer, or a combination thereof. In some embodiments, the third dielectric layer 117 may include a self-planarizing material such as a spin-on glass or a spin-on low-k dielectric material such as SiLK™. The use of a self-planarizing dielectric material may avoid the need to perform a subsequent planarizing step. In some embodiments, the third dielectric layer 117 may be formed by a deposition process including, for example, chemical vapor deposition, plasma enhanced chemical vapor deposition, evaporation, or spin-on coating. In some embodiments, the third dielectric layer 117 and the first dielectric layer 111 may be formed of the same material.

With reference to FIG. 10, in some embodiments, the fourth dielectric layer 119 may be, for example, silicon nitride, silicon oxide nitride, silicon oxynitride, the like, or a combination thereof. The fourth dielectric layer 119 may be formed by, for example, chemical vapor deposition, plasma enhanced chemical vapor deposition, or other applicable deposition process. In some embodiments, the fourth dielectric layer 119 may serve as a barrier layer to prevent moisture entering the underlying layers (e.g., the third dielectric layer 117 and the middle dielectric layer 115). In some embodiments, the thickness T6 of the third dielectric layer 117 is greater than the thickness T7 of the fourth dielectric layer 119.

With reference to FIG. 10, the first dielectric layer 111, the second dielectric layer 113, the middle dielectric layer 115, the third dielectric layer 117, and the fourth dielectric layer 119, the decoupling unit 121, and the plurality of conductive features 130 may together configure the first tier structure 100.

With reference to FIG. 10, a third mask layer 515 may be formed on the first tier structure 100. The third mask layer 515 may be a photoresist layer and may include the pattern of the first-tier-alignment mark 611 and the first-tier-alignment mark 711.

Due to the first-tier-alignment mark 611 and the first-tier-alignment mark 711 being concurrently formed, only the formation of the first-tier-alignment mark 611 is described for brevity and clarity.

Figure 11:
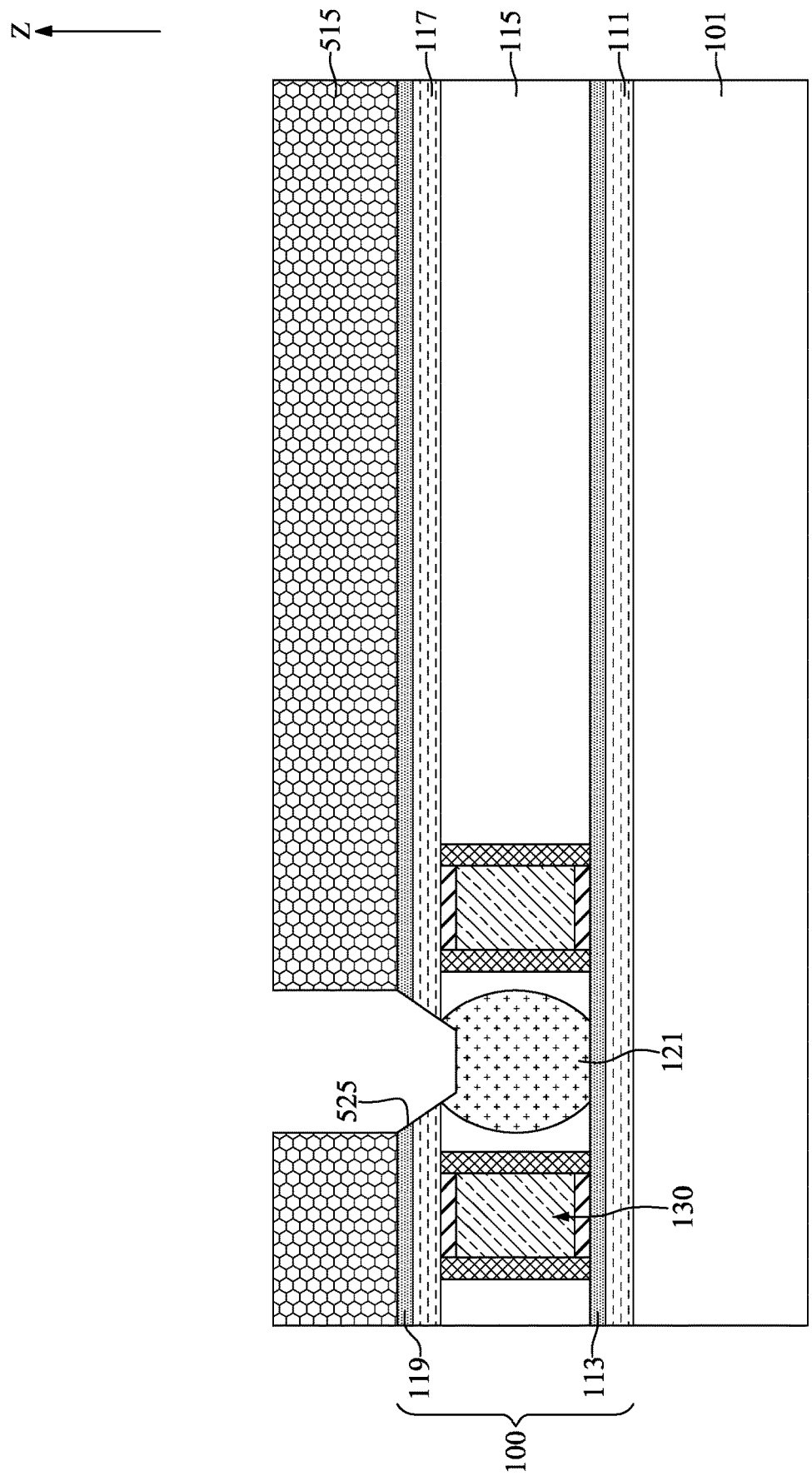

With reference to FIG. 11, an etch process, such as an anisotropic dry etch process, may be performed to remove portions of the fourth dielectric layer 119, portions of the third dielectric layer 117, and portions of the decoupling unit 121 to form a mark opening 525. In some embodiments, the sidewall of the mark opening 525 may be tapered. It should be noted that the mark opening 525 is used for forming the first-tier-alignment mark 611 and the mark opening for forming the first-tier-alignment mark 711 is not shown in FIG. 11 for brevity and clarity.

With reference to FIGS. 12 and 13, an insulating layer may be formed to completely fill the mark opening 525. The insulating layer may include a fluorescent material. In some embodiments, the fluorescent material may be azobenzene. In some embodiments, the insulating layer may be formed by, for example, chemical vapor deposition. A planarization process, such as chemical mechanical polishing, may be performed until the fourth dielectric layer 119 is exposed to remove excess material, provide a substantially flat surface for subsequent processing steps, and concurrently turn the insulating layer into the first-tier-alignment mark 611 (and the first-tier-alignment mark 711). Due to the profile of the first-tier-alignment mark 611 is determined by the mark opening 525. The sidewall 611SW of the first-tier-alignment mark 611 may be tapered.

In some embodiments, the width W1 between the two valleys 121VS of the sidewall 121SW of the decoupling unit 121 may be greater than the width W2 of the top surface 611TS of the first-tier-alignment mark 611. In some embodiments, the width W2 of the top surface 611TS of the first-tier-alignment mark 611 may be greater than the width W3 of the first-tier-alignment mark 611 at the interface between the middle dielectric layer 115 and the third dielectric layer 117. In some embodiments, the width W3 of the first-tier-alignment mark 611 at the interface between the middle dielectric layer 115 and the third dielectric layer 117 may be greater than the width W4 of the bottom surface 611BS of the first-tier-alignment mark 611. In some embodiments, the width W3 of the first-tier-alignment mark 611 at the interface between the middle dielectric layer 115 and the third dielectric layer 117 may be greater than the width W5 of the bottom surface 121BS of the decoupling unit 121. In some embodiments, the width ratio between the width W1 and the width W5 may be between about 1.5:1 and about 1.1:1 or between about 1.3:1 and about 1.1:1.

The first-tier-alignment mark 611 (and the first-tier-alignment mark 711) including fluorescent material may improve optical recognition during the following wafer fabrication process.

With reference to FIGS. 12 and 13, in some embodiments, the first-tier-alignment mark 611 and the first-tier-alignment mark 711 may be distant from each other. In some embodiments, the first-tier-alignment mark 611 and the first-tier-alignment mark 711 may be formed in a mirror manner according to a first axis of symmetry S1 in a top-view perspective.

Figure 14:
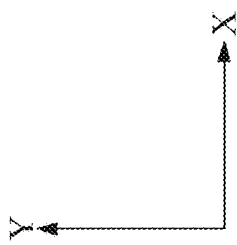
FIG. 14 illustrates, in a schematic top-view diagram, an intermediate semiconductor device in accordance with one embodiment of the present disclosure.
Figure 14:
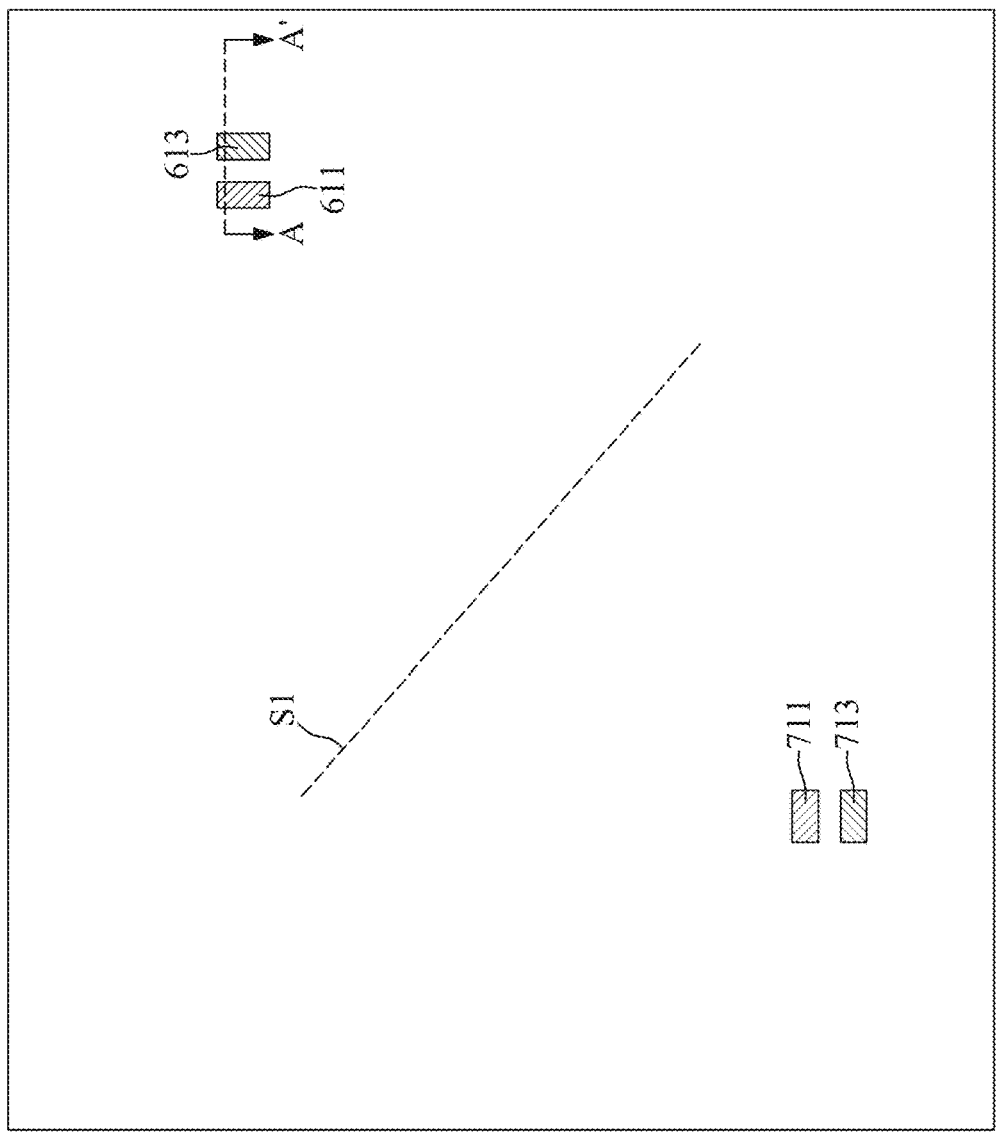
Figure 14:
Figure 15:
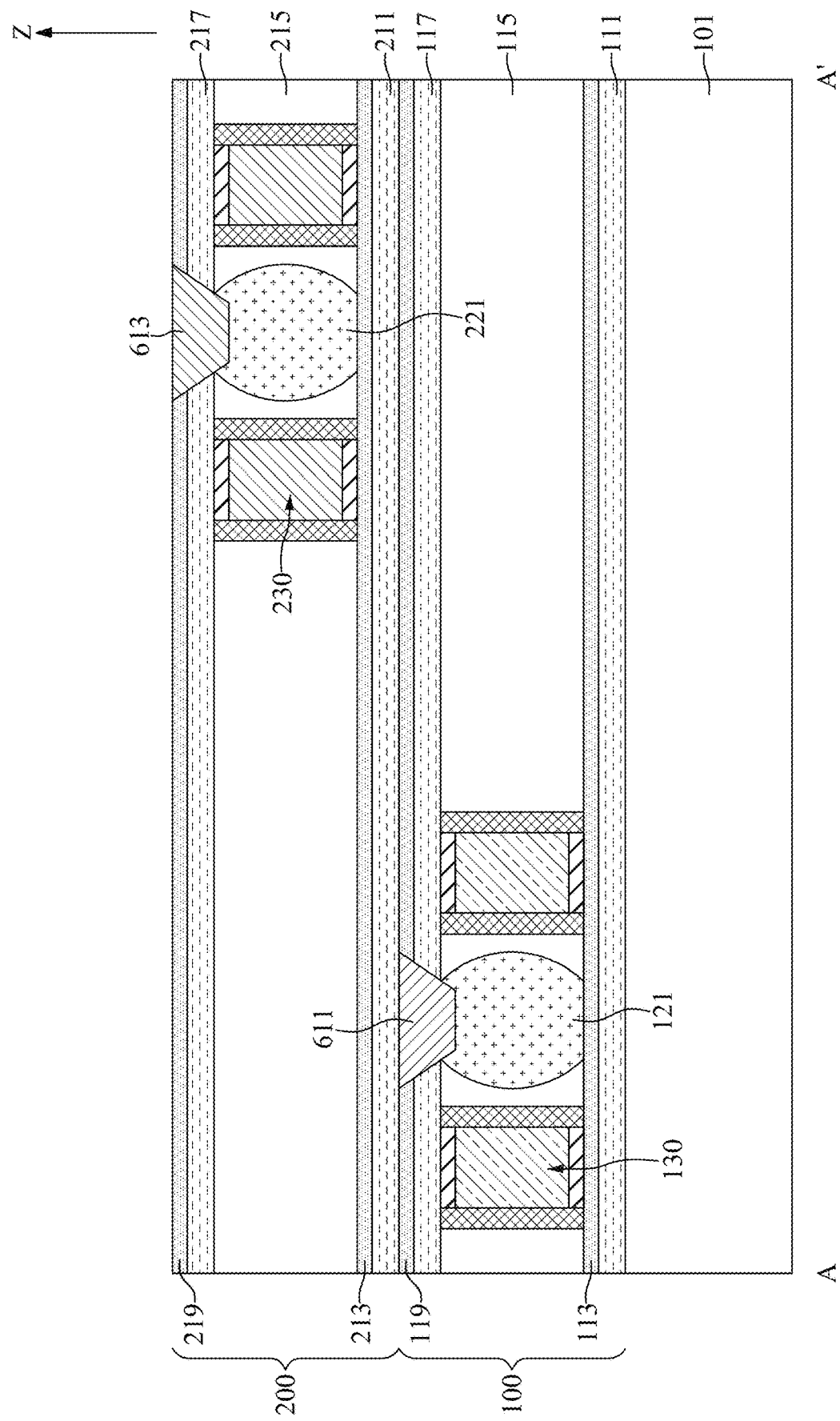
FIG. 15 is a schematic cross-sectional view diagram taken along a line A-A' in FIG. 14 illustrating part of the flow for fabricating the semiconductor device in accordance with one embodiment of the present disclosure.
Figure 16:
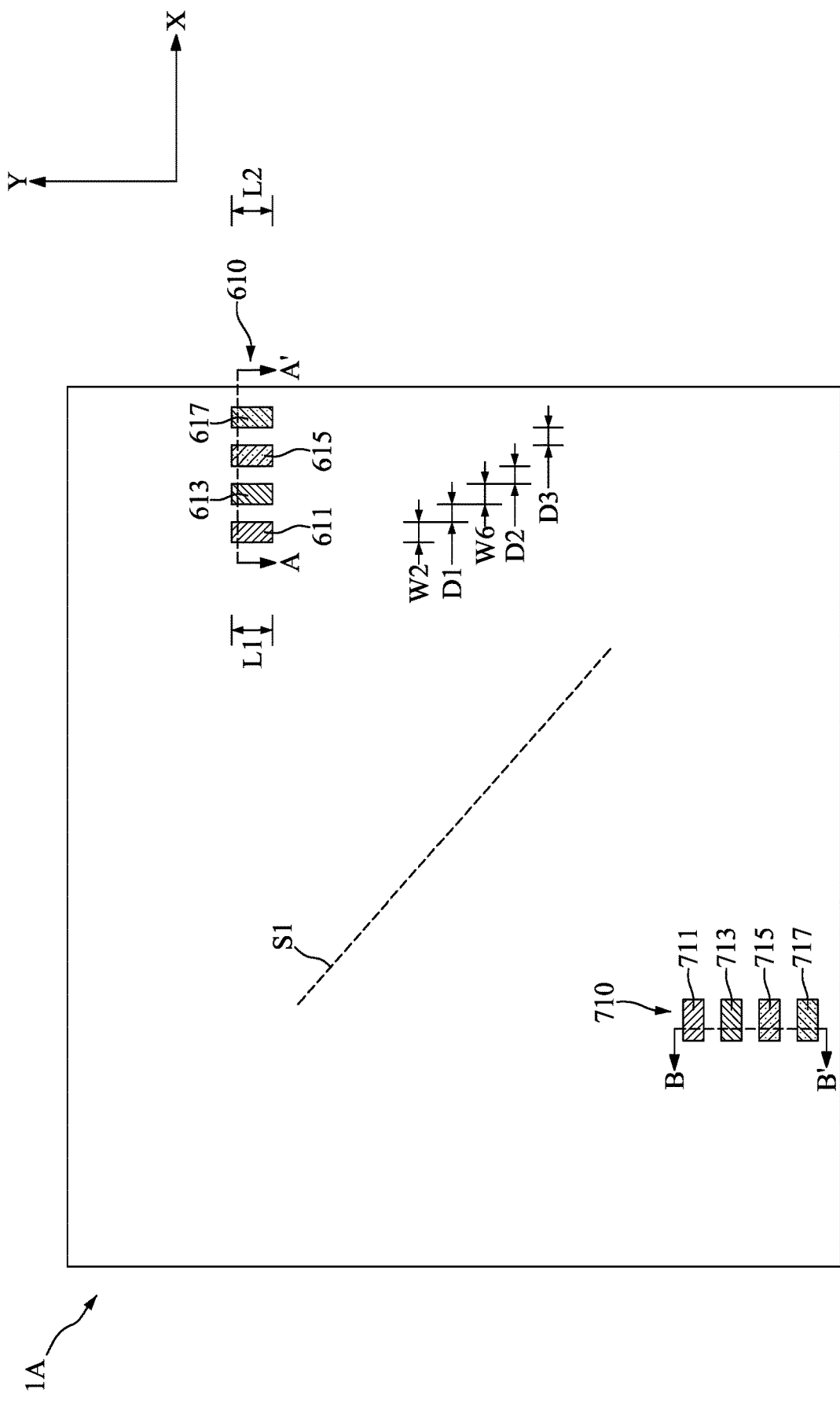
FIG. 16 illustrates, in a schematic top-view diagram, an intermediate semiconductor device in accordance with one embodiment of the present disclosure.
Figure 17:
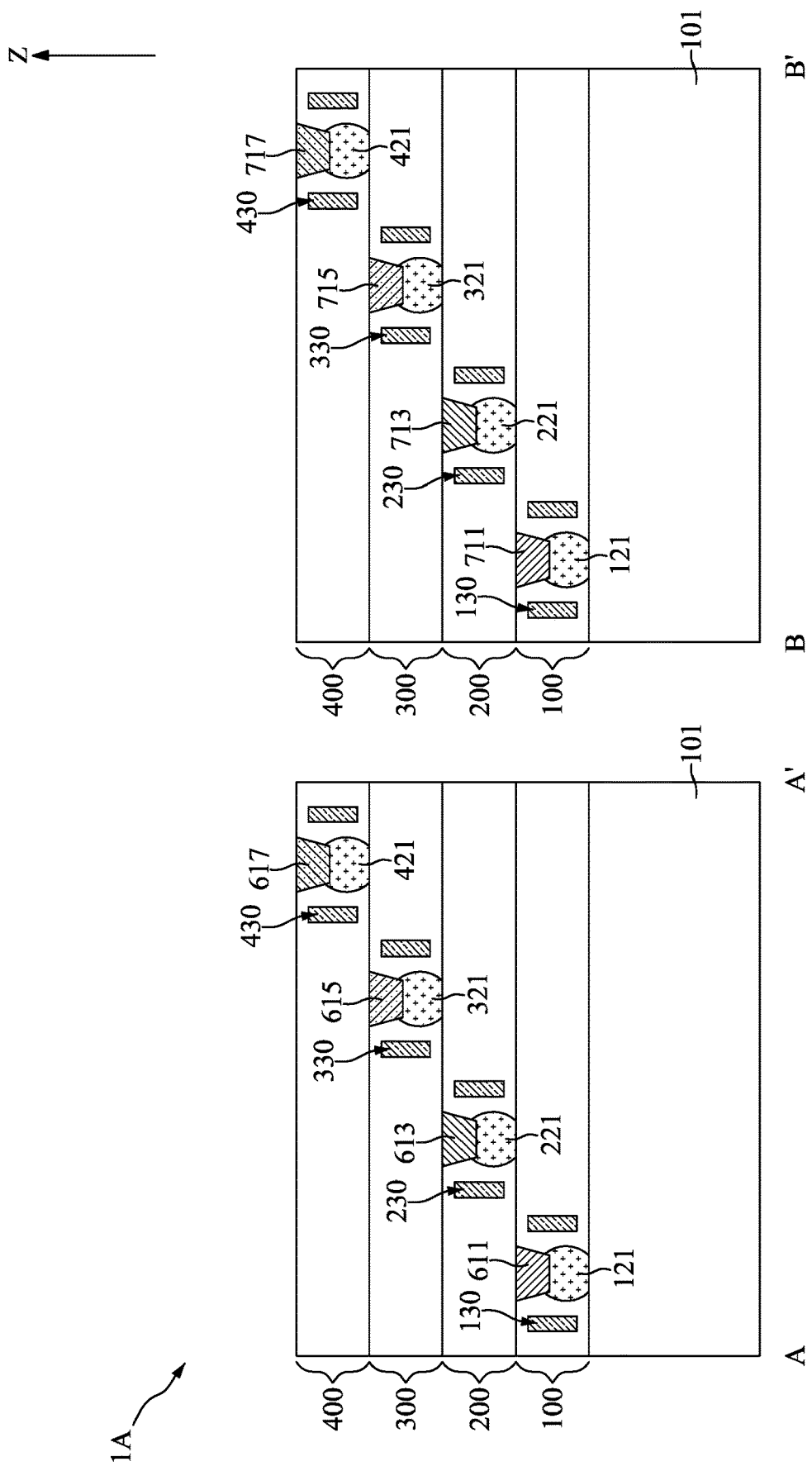
FIG. 17 is a schematic cross-sectional view diagram taken along a line A-A' in FIG. 16 illustrating part of the flow for fabricating the semiconductor device in accordance with one embodiment of the present disclosure.

FIG. 14 illustrates, in a schematic top-view diagram, an intermediate semiconductor device 1A in accordance with one embodiment of the present disclosure. FIG. 15 is a schematic cross-sectional view diagram taken along a line A-A' in FIG. 14 illustrating part of the flow for fabricating the semiconductor device 1A in accordance with one embodiment of the present disclosure. FIG. 16 illustrates, in a schematic top-view diagram, an intermediate semiconductor device 1A in accordance with one embodiment of the present disclosure. FIG. 17 is a schematic cross-sectional view diagram taken along a line A-A' in FIG. 16 illustrating part of the flow for fabricating the semiconductor device 1A in accordance with one embodiment of the present disclosure. It should be noted that some elements are omitted in FIGS. 14, 16, and 17 for clarity.

With reference to FIG. 1 and FIGS. 14 to 17, at step S17, a second tier structure 200, second-tier-alignment marks 613, 713, a third tier structure 300, third-tier-alignment marks 615, 715, a fourth tier structure 400, and fourth-tier-alignment marks 617, 717 may be formed over the first tier structure 100.

With reference to FIGS. 14 and 15, the second tier structure 200 may be formed on the first tier structure 100. The second tier structure 200 may include a first dielectric layer 211, a second dielectric layer 213, a middle dielectric layer 215, a third dielectric layer 217, a fourth dielectric layer 219, a plurality of conductive features 230, and a decoupling unit 221. The aforementioned elements of the second tier structure 200 may be formed with a procedure similar to the first tier structure 100, and descriptions thereof are not repeated herein. In some embodiments, the plurality of conductive features 230 may be deviated from the plurality of conductive features 130. The decoupling unit 221 may be formed between the plurality of conductive features 230. The second-tier-alignment mark 613 may be formed on the decoupling unit 221 with a procedure similar to the first-tier-alignment mark 611, and descriptions thereof are not repeated herein.

With reference to FIGS. 16 and 17, the third tier structure 300 may be formed on the second tier structure 200. The third-tier-alignment marks 615, 715 may be formed on the decoupling units 321 of the third tier structure 300, respectively and correspondingly. The fourth tier structure 400 may be formed on the third tier structure 300. The fourth-tier-alignment marks 617, 717 may be formed on the decoupling units 421 of the fourth tier structure 400, respectively and correspondingly. The aforementioned elements may be formed with a procedure similar to the second tier structure 200 and the decoupling unit 221, respectively and correspondingly, and descriptions thereof are not repeated herein.

The first-tier-alignment mark 611, the second-tier-alignment mark 613, the third-tier-alignment mark 615, and the fourth-tier-alignment mark 617 may be referred to as a first subset of solid alignment marks 610. The first-tier-alignment mark 711, the second-tier-alignment mark 713, the third-tier-alignment mark 715, and the fourth-tier-alignment mark 717 may be referred to as a first subset of spaced alignment marks 710.

In some embodiments, the first-tier-alignment marks 611 may be line shaped in a top-view perspective. The first-tier-alignment mark 611 may extend along the direction Y.

In a cross-sectional perspective, the second-tier-alignment mark 613 may be in the second tier structure 200 and may be deviated from the first-tier-alignment mark 611. In other words, the second-tier-alignment mark 613 may not be directly above the first-tier-alignment mark 611. In a top-view perspective, the second-tier-alignment mark 613 may be line shaped. The second-tier-alignment mark 613 may extend along the direction Y and may be separated from the first-tier-alignment mark 611 along the direction X.

In a cross-sectional perspective, the third-tier-alignment mark 615 may be in the third tier structure 300 and may be deviated from the second-tier-alignment mark 613. In other words, the third-tier-alignment mark 615 may not be directly above the second-tier-alignment mark 613. In a top-view perspective, the third-tier-alignment mark 615 may be line shaped. The third-tier-alignment mark 615 may extend along the direction Y and may be separated from the second-tier-alignment mark 613 along the direction X. The second-tier-alignment mark 613 may be between the first-tier-alignment mark 611 and the third-tier-alignment mark 615.

In a cross-sectional perspective, the fourth-tier-alignment mark 617 may be in the fourth tier structure 400 and may be deviated from the third-tier-alignment mark 615. In other words, the fourth-tier-alignment mark 617 may not be directly above the third-tier-alignment mark 615. In a top-view perspective, the fourth-tier-alignment mark 617 may be line shaped. The fourth-tier-alignment mark 617 may extend along the direction Y and may be separated from the third-tier-alignment mark 615 along the direction X. The third-tier-alignment mark 615 may be disposed between the second-tier-alignment mark 613 and the fourth-tier-alignment mark 617.

In some embodiments, the first-tier-alignment mark 611, the second-tier-alignment mark 613, the third-tier-alignment mark 615, and the fourth-tier-alignment mark 617 may be aligned to each other along the direction Y. In some embodiments, the first-tier-alignment mark 611, the second-tier-alignment mark 613, the third-tier-alignment mark 615, and the fourth-tier-alignment mark 617 may not be aligned to each other along the direction Y.

In some embodiments, in a top-view perspective, the length L1 of the first-tier-alignment mark 611 and the width W2 of the first-tier-alignment mark 611 may be different. For example, the length L1 of the first-tier-alignment mark 611 may be greater than the width W2 of the first-tier-alignment mark 611. In some embodiments, the length L1 of the first-tier-alignment mark 611 and the width W2 of the first-tier-alignment mark 611 may be substantially the same.

In some embodiments, the lengths of the second-tier-alignment mark 613, the third-tier-alignment mark 615, the fourth-tier-alignment mark 617 may be substantially the same as the length L1 of the first-tier-alignment mark 611. In some embodiments, the lengths of the second-tier-alignment mark 613, the third-tier-alignment mark 615, the fourth-tier-alignment mark 617 may be different from the length L1 of the first-tier-alignment mark 611. For example, the length L2 of the second-tier-alignment mark 613 may be the same as or different from the length L1 of the first-tier-alignment mark 611.

In some embodiments, the widths of the second-tier-alignment mark 613, the third-tier-alignment mark 615, the fourth-tier-alignment mark 617 may be substantially the same as the width W2 of the second-tier-alignment mark 613. In some embodiments, the widths of the second-tier-alignment mark 613, the third-tier-alignment mark 615, the fourth-tier-alignment mark 617 may be different from the width W2 of the first-tier-alignment mark 611. For example, the width W6 of the second-tier-alignment mark 613 may be the same as or different from the width W2 of the first-tier-alignment mark 611.

In some embodiments, in a top-view perspective, the width W2 of the first-tier-alignment mark 611 and the distance D1 between the first-tier-alignment mark 611 and the second-tier-alignment mark 613 may be different. For example, the width W2 of the first-tier-alignment mark 611 may be greater than the distance D1 between the first-tier-alignment mark 611 and the second-tier-alignment mark 613. In some embodiments, the width W2 of the second-tier-alignment mark 613 and the distance D1 between the first-tier-alignment mark 611 and the second-tier-alignment mark 613 may be substantially the same.

In some embodiments, in a top-view perspective, the distances D1, D2, D3 between the first-tier-alignment mark 611, the second-tier-alignment mark 613, the third-tier-alignment mark 615, and the fourth-tier-alignment mark 617 may be substantially the same. In some embodiments, the distances D1, D2, D3 between the first-tier-alignment mark 611, the second-tier-alignment mark 613, the third-tier-alignment mark 615, and the fourth-tier-alignment mark 617 may be different. For example, the distance D1 between the first-tier-alignment mark 611 and the second-tier-alignment mark 613 may be greater than or less than the distance D2 between the second-tier-alignment mark 613 and the third-tier-alignment mark 615.

The first-tier-alignment mark 611, the second-tier-alignment mark 613, the third-tier-alignment mark 615, and the fourth-tier-alignment mark 617 may include a fluorescent material. In some embodiments, the fluorescent material may be azobenzene. The first-tier-alignment mark 611, the second-tier-alignment mark 613, the third-tier-alignment mark 615, and the fourth-tier-alignment mark 617 including the fluorescent material may improve optical recognition during the wafer fabrication process.

With reference to FIGS. 16 and 17, the first subset of spaced alignment marks 710 and the first subset of solid alignment marks 610 may be formed in a mirror manner according to the first axis of symmetry S1. Detailedly, the first-tier-alignment mark 711 and the first-tier-alignment mark 611 may be formed in the mirror manner according to the first axis of symmetry S1. The second-tier-alignment mark 713 and the second-tier-alignment mark 613 may be formed in the mirror manner according to the first axis of symmetry S1. The third-tier-alignment mark 715 and the third-tier-alignment mark 615 may be formed in the mirror manner according to the first axis of symmetry S1. The fourth-tier-alignment mark 717 and the fourth-tier-alignment mark 617 may be disposed in the mirror manner according to the first axis of symmetry S1.

The first-tier-alignment mark 711, the second-tier-alignment mark 713, the third-tier-alignment mark 715, and the fourth-tier-alignment mark 717 may include a fluorescent material. In some embodiments, the fluorescent material may be azobenzene. The first-tier-alignment mark 711, the second-tier-alignment mark 713, the third-tier-alignment mark 715, and the fourth-tier-alignment mark 717 including the fluorescent material may improve optical recognition during the wafer fabrication process.

Figure 18:
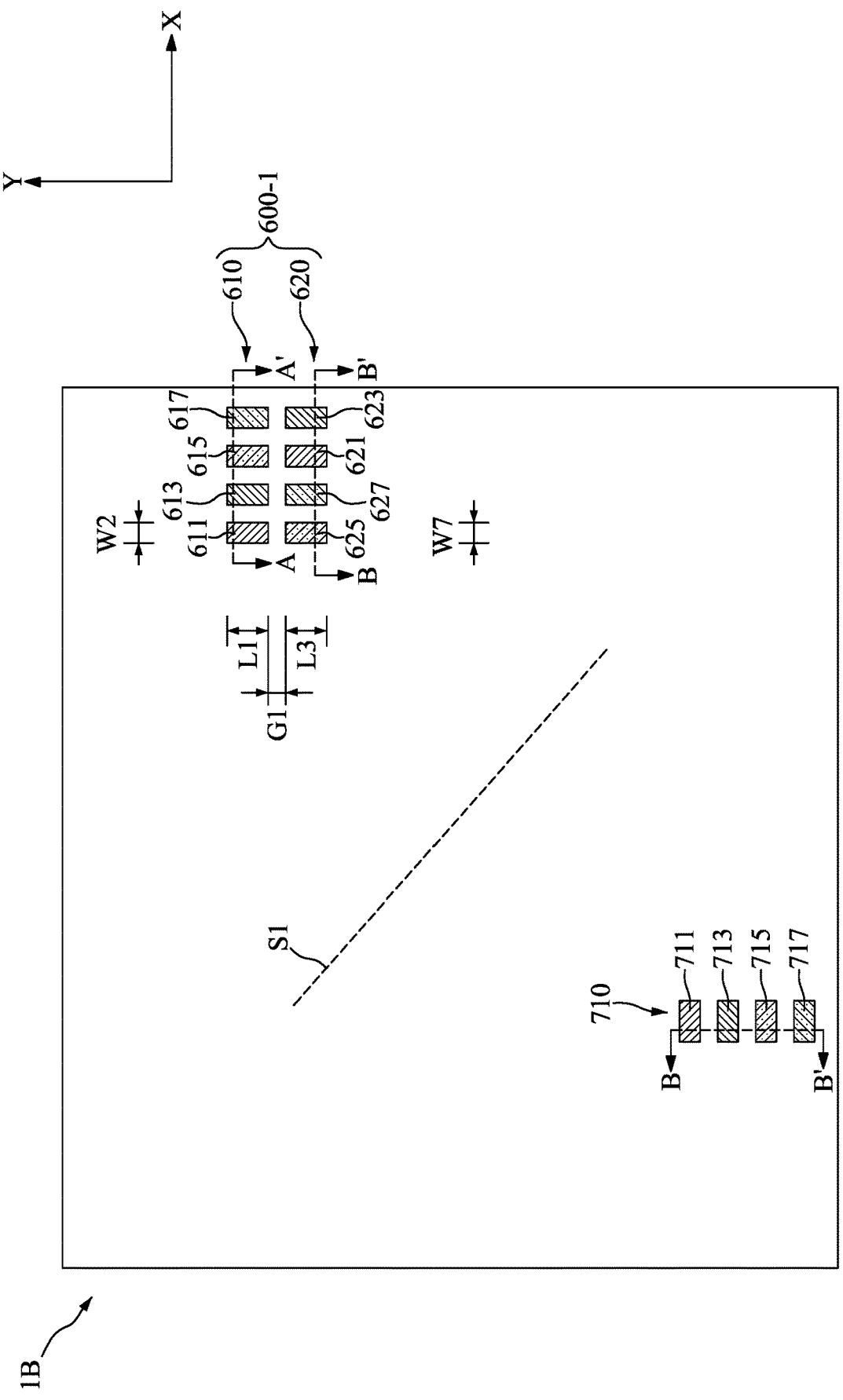
FIG. 18 illustrates, in a schematic top-view diagram, a semiconductor device in accordance with another embodiment of the present disclosure.
Figure 19:
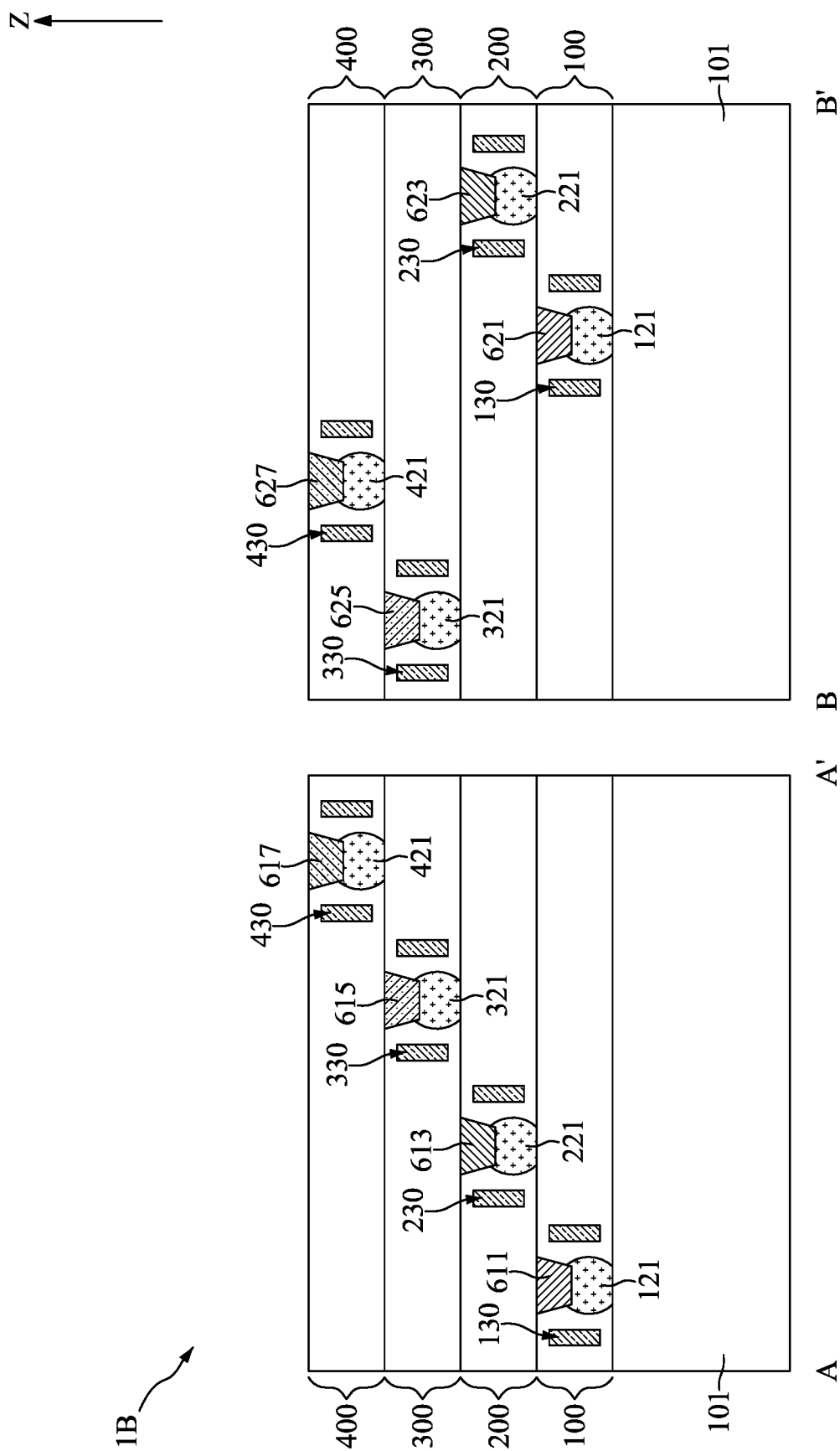
FIG. 19 is a schematic cross-sectional view diagram taken along lines A-A' and B-B' in FIG. 18.

FIG. 18 illustrates, in a schematic top-view diagram, a semiconductor device 1B in accordance with another embodiment of the present disclosure. FIG. 19 is a schematic cross-sectional view diagram taken along lines A-A' and B-B' in FIG. 18. It should be noted that some elements are omitted in FIGS. 18 and 19 for clarity.

With reference to FIGS. 18 and 19, the semiconductor device 1B may have a structure similar to that illustrated in FIGS. 16 and 17. The same or similar elements in FIGS. 18 and 19 as in FIGS. 16 and 17 have been marked with similar reference numbers and duplicative descriptions have been omitted.

With reference to FIGS. 18 and 19, the semiconductor device 1B may include a second subset of solid alignment marks 620. The first subset of solid alignment marks 610 and a second subset of solid alignment marks 620 may configure a first set of solid alignment marks 600-1. The second subset of solid alignment marks 620 may include a first-tier-alignment mark 621, a second-tier-alignment mark 623, a third-tier-alignment mark 625, and a fourth-tier-alignment mark 627.

With reference to FIGS. 18 and 19, in some embodiments, the first-tier-alignment mark 621 may be line shaped in a top-view perspective. The first-tier-alignment mark 621 may extend along the direction Y. The first-tier-alignment mark 621 may be aligned with the third-tier-alignment mark 615 along the direction X and separated from the third-tier-alignment mark 615 along the direction Y. In a cross-sectional perspective, the first-tier-alignment mark 621 may be disposed in the first tier structure 100 and on the corresponding decoupling unit 121.

In a cross-sectional perspective, the second-tier-alignment mark 623 may be disposed in the second tier structure 200, deviated from the first-tier-alignment mark 621, and on the corresponding decoupling unit 221. In other words, the second-tier-alignment mark 623 may not be directly above the first-tier-alignment mark 621. In a top-view perspective, the second-tier-alignment mark 623 may be line shaped. The second-tier-alignment mark 623 may extend along the direction Y and may be separated from the first-tier-alignment mark 621 along the direction X. The second-tier-alignment mark 623 may be aligned with the fourth-tier-alignment mark 617 along the direction X and separated from the fourth-tier-alignment mark 617 along the direction Y.

In a cross-sectional perspective, the third-tier-alignment mark 625 may be disposed in the third tier structure 300, deviated from the second-tier-alignment mark 623, and on the corresponding decoupling unit 321. In other words, the third-tier-alignment mark 625 may not be directly above the second-tier-alignment mark 623. In a top-view perspective, the third-tier-alignment mark 625 may be line shaped. The third-tier-alignment mark 625 may extend along the direction Y and may be distant from the first-tier-alignment mark 621 along the direction X. The third-tier-alignment mark 625 may be aligned with the first-tier-alignment mark 621 along the direction X and separated from the first-tier-alignment mark 621 along the direction Y.

In a cross-sectional perspective, the fourth-tier-alignment mark 627 may be disposed in the fourth tier structure 400, deviated from the third-tier-alignment mark 625, and on the corresponding decoupling unit 421. In other words, fourth-tier-alignment mark 627 may not be directly above the third-tier-alignment mark 625. In a top-view perspective, the fourth-tier-alignment mark 627 may be line shaped. The fourth-tier-alignment mark 627 may extend along the direction Y and may be separated from the third-tier-alignment mark 625 along the direction X. For example, the fourth-tier-alignment mark 627 may be disposed between the first-tier-alignment mark 621 and the third-tier-alignment mark 625. For another example, the fourth-tier-alignment mark 627 may be aligned with the second-tier-alignment mark 613 along the direction X. The fourth-tier-alignment mark 627 may be separated from the second-tier-alignment mark 613 along the direction Y.

In some embodiments, the first-tier-alignment mark 621, the second-tier-alignment mark 623, the third-tier-alignment mark 625, and the fourth-tier-alignment mark 627 may be aligned to each other along the direction Y. In some embodiments, the first-tier-alignment mark 621, the second-tier-alignment mark 623, the third-tier-alignment mark 625, and the fourth-tier-alignment mark 627 may not be aligned to each other along the direction Y.

In some embodiments, the width W7 of the first-tier-alignment mark 621 and the width W2 of the first-tier-alignment mark 611 may be substantially the same. In some embodiments, the width W7 of the first-tier-alignment mark 621 and the width W2 of the first-tier-alignment mark 611 may be different. In some embodiments, the length L3 of the first-tier-alignment mark 621 and the length L1 of the first-tier-alignment mark 611 may be substantially the same. In some embodiments, the length L3 of the first-tier-alignment mark 621 and the length L1 of the first-tier-alignment mark 611 may be different.

In some embodiments, the lengths of the second-tier-alignment mark 623, the third-tier-alignment mark 625, the fourth-tier-alignment mark 627 may be substantially the same as the length L3 of the first-tier-alignment mark 621. In some embodiments, the lengths of the second-tier-alignment mark 623, the third-tier-alignment mark 625, the fourth-tier-alignment mark 627 may be different from the length L3 of the first-tier-alignment mark 621. In some embodiments, the widths of the second-tier-alignment mark 623, the third-tier-alignment mark 625, the fourth-tier-alignment mark 627 may be substantially the same as the width W7 of the first-tier-alignment mark 621. In some embodiments, the widths of the second-tier-alignment mark 623, the third-tier-alignment mark 625, the fourth-tier-alignment mark 627 may be different from the width W7 of the first-tier-alignment mark 621.

In some embodiments, the length L1 of the first-tier-alignment mark 611 and the distance G1 between the third-tier-alignment mark 615 and the first-tier-alignment mark 621 may be substantially the same. In some embodiments, the length L1 of the first-tier-alignment mark 611 and the distance G1 between the third-tier-alignment mark 615 and the first-tier-alignment mark 621 may be different. For example, the length L1 of the first-tier-alignment mark 611 may be greater than the distance G1 between the third-tier-alignment mark 615 and the first-tier-alignment mark 621.

In some embodiments, the width W2 of the first-tier-alignment mark 611 and the distance G1 between the third-tier-alignment mark 615 and the first-tier-alignment mark 621 may be substantially the same. In some embodiments, the width W2 of the first-tier-alignment mark 611 and the distance G1 between the third-tier-alignment mark 615 and the first-tier-alignment mark 621 may be different. For example, the width W2 of the first-tier-alignment mark 611 may be greater than the distance G1 between the third-tier-alignment mark 615 and the first-tier-alignment mark 621.

In some embodiments, the first-tier-alignment mark 621, the second-tier-alignment mark 623, the third-tier-alignment mark 625, and the fourth-tier-alignment mark 627 may include a fluorescent material. In some embodiments, the fluorescent material may be azobenzene. The first-tier-alignment mark 621, the second-tier-alignment mark 623, the third-tier-alignment mark 625, and the fourth-tier-alignment mark 627 including the fluorescent material may improve optical recognition during the wafer fabrication process.

Figure 20:
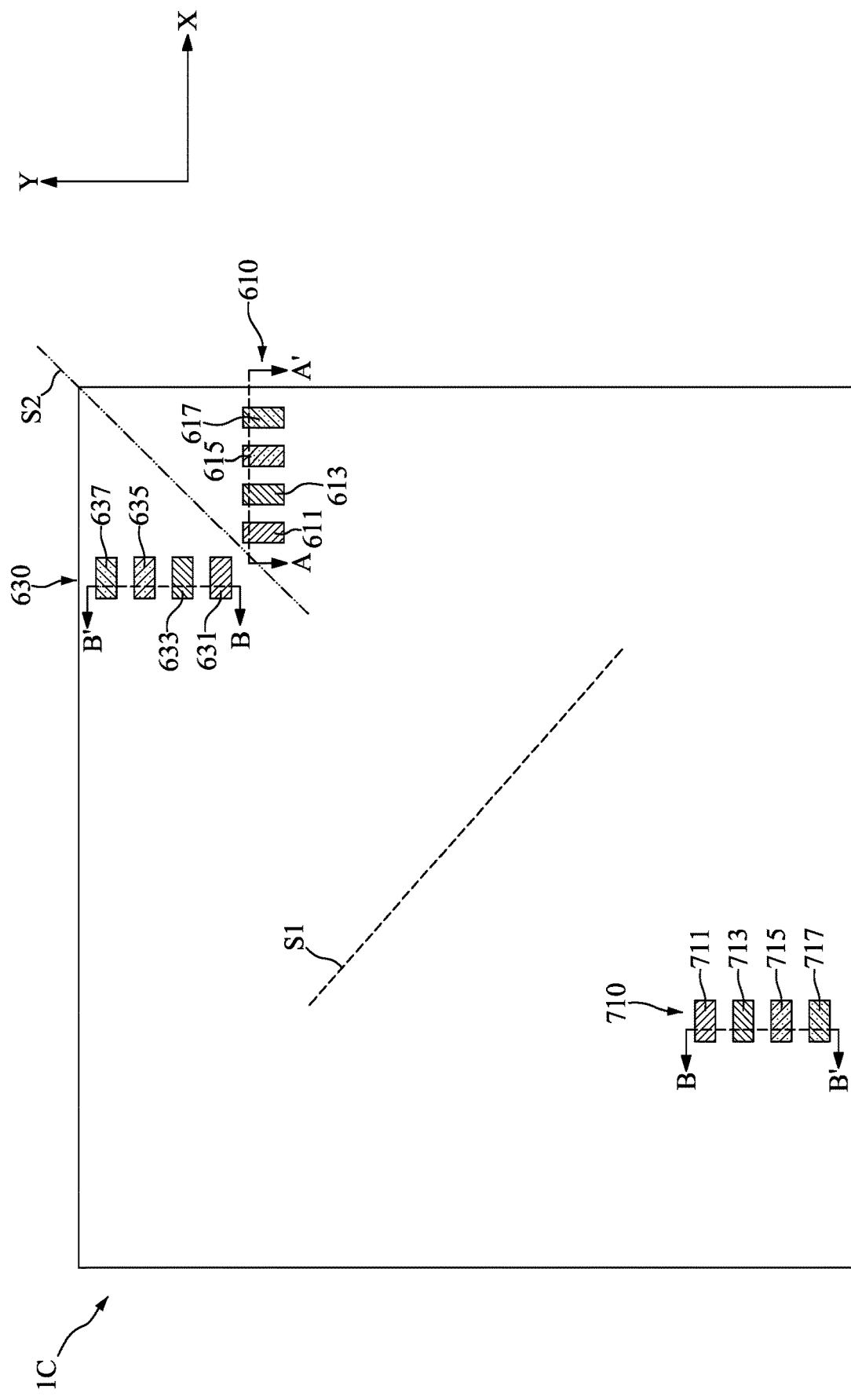
FIG. 20 illustrates, in a schematic top-view diagram, a semiconductor device in accordance with another embodiment of the present disclosure.
Figure 21:
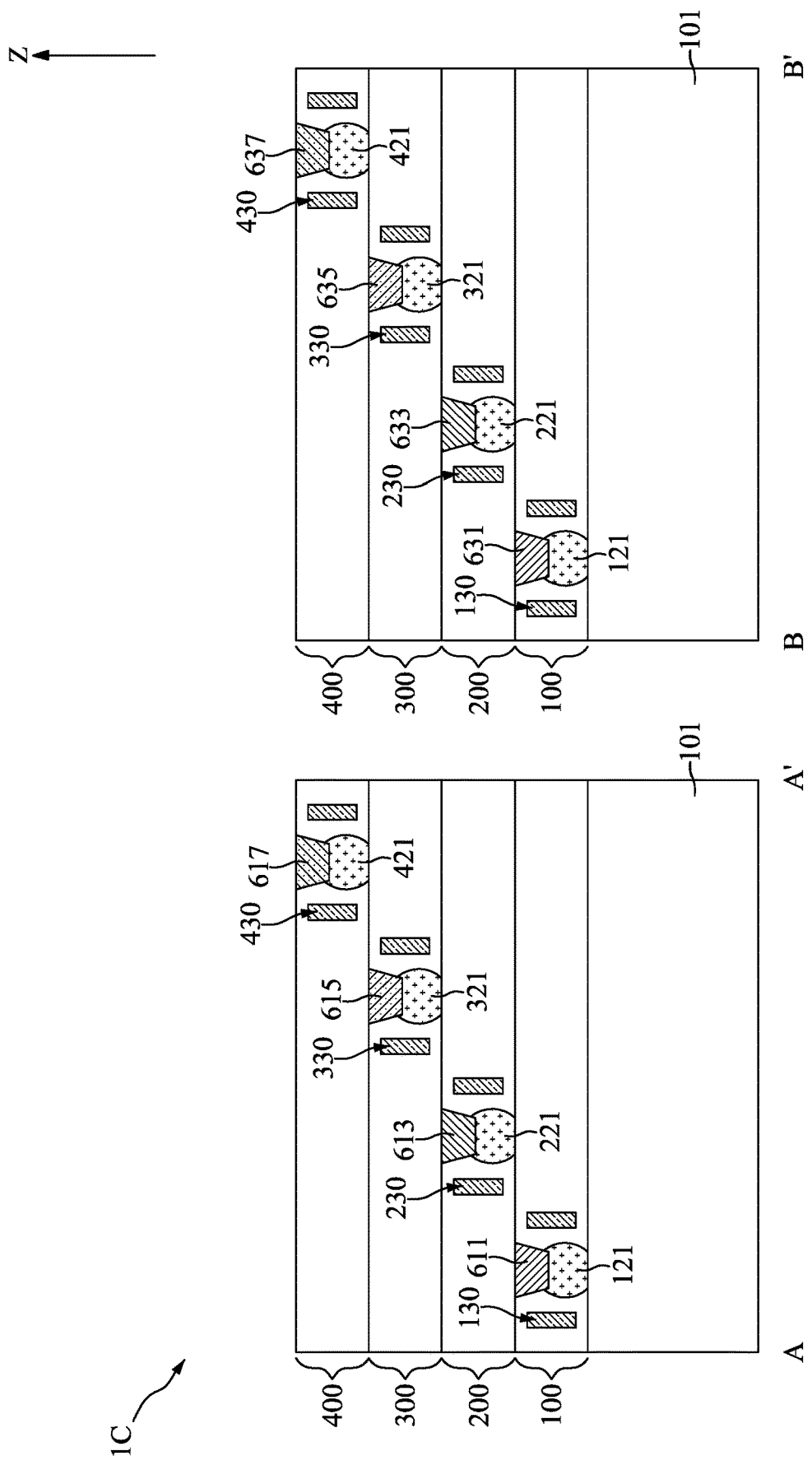
FIG. 21 is a schematic cross-sectional view diagram taken along lines A-A' and B-B' in FIG. 20.

FIG. 20 illustrates, in a schematic top-view diagram, a semiconductor device 1C in accordance with another embodiment of the present disclosure. FIG. 21 is a schematic cross-sectional view diagram taken along lines A-A' and B-B' in FIG. 20. It should be noted that some elements are omitted in FIGS. 20 and 21 for clarity.

With reference to FIGS. 20 and 21, the semiconductor device 1C may have a structure similar to that illustrated in FIGS. 16 and 17. The same or similar elements in FIGS. 20 and 21 as in FIGS. 16 and 17 have been marked with similar reference numbers and duplicative descriptions have been omitted.

With reference to FIGS. 20 and 21, the semiconductor device 1C may include a third subset of solid alignment marks 630. The third subset of solid alignment marks 630 and the first subset of solid alignment marks 610 may be disposed in a mirror manner according to the second axis of symmetry S2. Detailedly, the third subset of solid alignment marks 630 may include a first-tier-alignment mark 631, a second-tier-alignment mark 633, a third-tier-alignment mark 635, and a fourth-tier-alignment mark 637. The first-tier-alignment mark 631 and the first-tier-alignment mark 611 may be disposed in the mirror manner according to the second axis of symmetry S2. The second-tier-alignment mark 633 and the second-tier-alignment mark 613 may be disposed in the mirror manner according to the second axis of symmetry S2. The third-tier-alignment mark 635 and the third-tier-alignment mark 615 may be disposed in the mirror manner according to the second axis of symmetry S2. The fourth-tier-alignment mark 637 and the fourth-tier-alignment mark 617 may be disposed in the mirror manner according to the second axis of symmetry S2.

Figure 22:
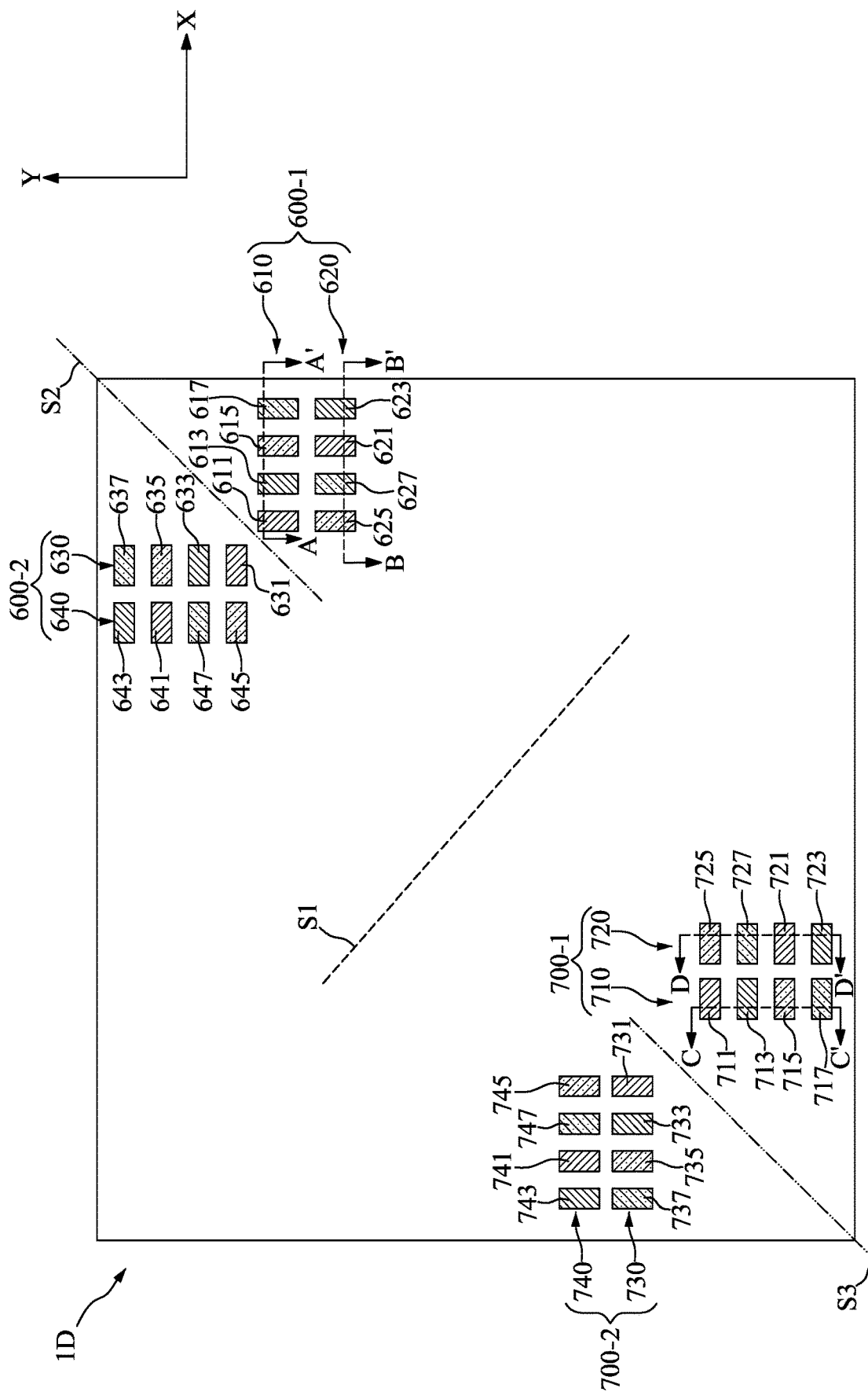
FIG. 22 illustrates, in a schematic top-view diagram, a semiconductor device in accordance with another embodiment of the present disclosure.
Figure 23:
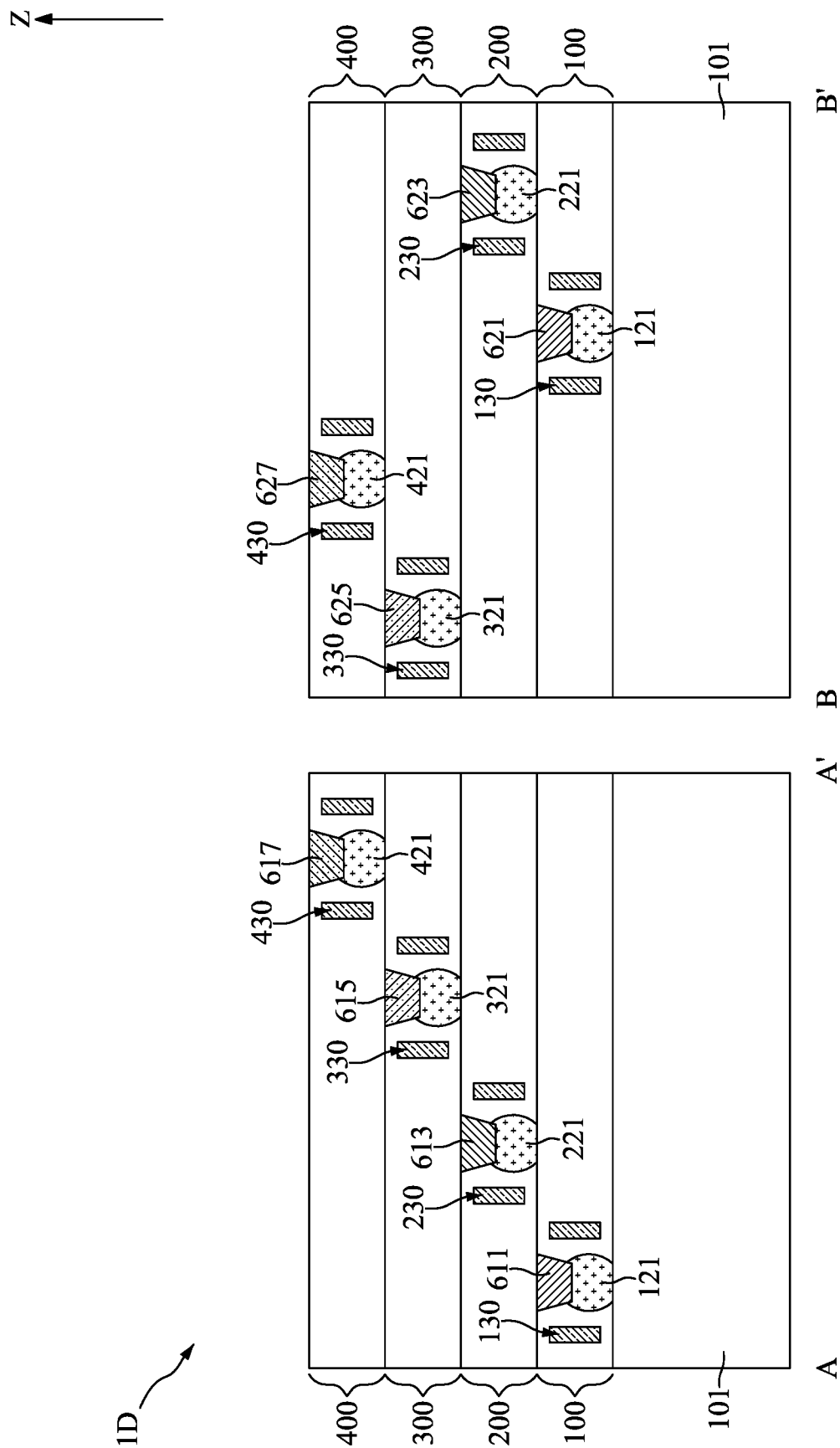
FIG. 23 is a schematic cross-sectional view diagram taken along lines A-A' and B-B' in FIG. 22.
Figure 24:
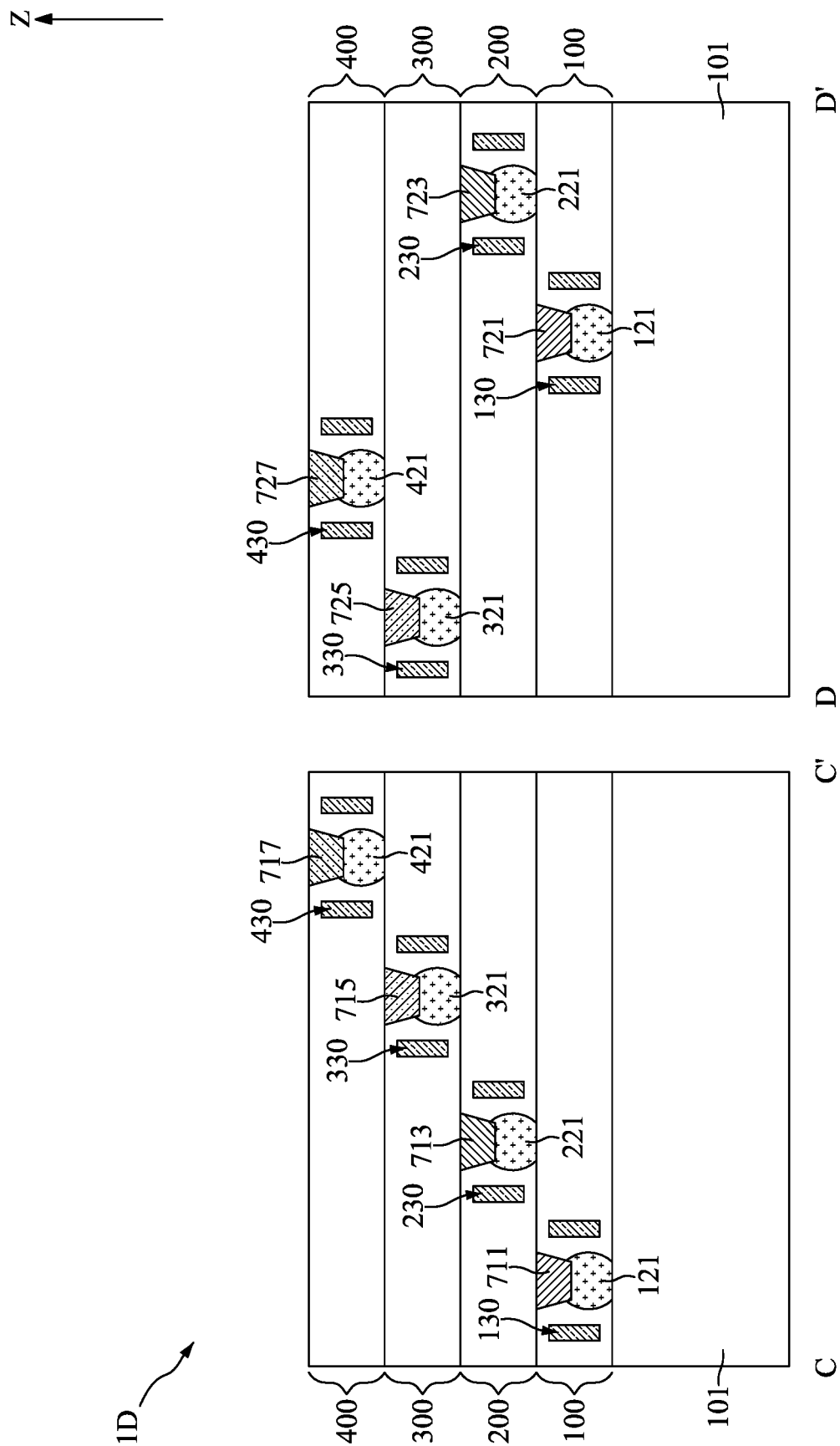
FIG. 24 is a schematic cross-sectional view diagram taken along lines C-C' and D-D' in FIG. 22.

FIG. 22 illustrates, in a schematic top-view diagram, a semiconductor device 1D in accordance with another embodiment of the present disclosure. FIG. 23 is a schematic cross-sectional view diagram taken along lines A-A' and B-B' in FIG. 22. FIG. 24 is a schematic cross-sectional view diagram taken along lines C-C' and D-D' in FIG. 22. It should be noted that some elements are omitted in FIGS. 22 to 24 for clarity.

With reference to FIGS. 22 to 24, the semiconductor device 1D may have a structure similar to that illustrated in FIGS. 20 and 21. The same or similar elements in FIGS. 22 to 24 as in FIGS. 20 and 21 have been marked with similar reference numbers and duplicative descriptions have been omitted.

With reference to FIGS. 22 to 24, the semiconductor device 1D may include a second subset of solid alignment marks 620, a third subset of solid alignment marks 630, a fourth subset of solid alignment marks 640, a second subset of spaced alignment marks 720, a third subset of spaced alignment marks 730, and a fourth subset of spaced alignment marks 740. The first subset of solid alignment marks 610 and the second subset of solid alignment marks 620 together configure a first set of solid alignment marks 600-1. The third subset of solid alignment marks 630 and the fourth subset of solid alignment marks 640 together configure a second set of solid alignment marks 600-2. The first subset of spaced alignment marks 710 and the second subset of spaced alignment marks 720 together configure a first set of spaced alignment marks 700-1. The third subset of spaced alignment marks 730 and the fourth subset of spaced alignment marks 740 together configure a second set of spaced alignment marks 700-2.

With reference to FIGS. 22 to 24, the second subset of solid alignment marks 620 may be disposed in a manner similar to that illustrated in FIGS. 18 and 19, and descriptions thereof are not repeated herein. The third subset of solid alignment marks 630 may be disposed in a manner similar to that illustrated in FIGS. 20 and 21, and descriptions thereof are not repeated herein.

With reference to FIGS. 22 to 24, the second subset of spaced alignment marks 720 may include a first-tier-alignment mark 721, a second-tier-alignment mark 723, a third-tier-alignment mark 725, and a fourth-tier-alignment mark 727. The second subset of spaced alignment marks 720 and the second subset of solid alignment marks 620 may be disposed in a mirror manner according to the first axis of symmetry S1.

With reference to FIGS. 22 to 24, the third subset of spaced alignment marks 730 may include a first-tier-alignment mark 731, a second-tier-alignment mark 733, a third-tier-alignment mark 735, and a fourth-tier-alignment mark 737. The third subset of spaced alignment marks 730 may be disposed in a mirror manner of the first subset of spaced alignment marks 710 according to the third axis of symmetry S3 or the third subset of spaced alignment marks 730 may be disposed in a mirror manner of the third subset of solid alignment marks 630 according to the first axis of symmetry S1, and descriptions thereof are not repeated herein.

With reference to FIGS. 22 to 24, the fourth subset of spaced alignment marks 740 may include a first-tier-alignment mark 741, a second-tier-alignment mark 743, a thirdtier-alignment mark 745, and a fourth-tier-alignment mark 747. The fourth subset of spaced alignment marks 740 may be disposed in a mirror manner of the second subset of spaced alignment marks 720 according to the third axis of symmetry S3 or the fourth subset of spaced alignment marks 740 may be disposed in a mirror manner of the fourth subset of solid alignment marks 640 according to the first axis of symmetry S1, and descriptions thereof are not repeated herein.

One aspect of the present disclosure provides a semiconductor device including a first tier structure including a plurality of conductive features of the first tier structure positioned over a substrate, and a decoupling unit of the first tier structure positioned between the plurality of conductive features of the first tier structure; a first set of solid alignment marks including a first-tier-alignment mark positioned on the decoupling unit of the first tier structure, and including a fluorescent material; a second tier structure positioned on the first tier structure and including a plurality of conductive features of the second tier structure positioned over and deviated from the plurality of conductive features of the first tier structure, and a decoupling unit of the second tier structure positioned over the first tier structure, and positioned between the plurality of conductive features of the second tier structure; and a first set of spaced alignment marks including a second-tier-alignment mark positioned on the decoupling unit of the second tier structure, and including a fluorescent material. The decoupling units of the first tier structure and the second tier structure include a low-k dielectric material and respectively include a bottle-shaped cross-sectional profile.

Another aspect of the present disclosure provides a semiconductor device including a first tier structure positioned on a substrate and including: a plurality of conductive features of the first tier structure positioned over the substrate, and a decoupling unit of the first tier structure positioned between the plurality of conductive features of the first tier structure, and including a bottle-shaped cross-sectional profile; a first set of solid alignment marks including: a first-tier-alignment mark of the first set of solid alignment marks positioned on the decoupling unit of the first tier structure; a first set of spaced alignment marks including: a first-tier-alignment mark of the first set of spaced alignment marks positioned in a mirror manner of the first-tier-alignment mark of the first set of solid alignment marks according to a first axis of symmetry. The first-tier-alignment mark of the first set of solid alignment marks and the first-tier-alignment mark of the first set of spaced alignment marks include a fluorescent material. The decoupling unit of the first tier structure includes a low-k dielectric material.

Another aspect of the present disclosure provides a method for fabricating a semiconductor device including forming a first tier structure over a substrate and including: a plurality of conductive features over the substrate, and a decoupling unit between the plurality of conductive features; forming a first set of solid alignment marks including a first-tier-alignment mark on the decoupling unit of the first tier structure; forming a second tier structure over the first tier structure and including: a plurality of conductive features over the first tier structure, and a decoupling unit between the plurality of conductive features; and forming a first set of spaced alignment marks including a second-tier-alignment mark on the decoupling unit of the second tier structure. The first-tier-alignment mark and the second-tier-alignment mark includes a fluorescent material. The decoupling units of the first tier structure and the second tier structure include a low-k dielectric material.

Due to the design of the semiconductor device of the present disclosure, the first-tier-alignment marks 611, 621, 631, 641, 711, 721, 731, 741, the second-tier-alignment marks 613, 623, 633, 643, 713, 723, 733, 743, the third-tier-alignment marks 615, 625, 635, 645, 715, 725, 735, 745, and the fourth-tier-alignment marks 617, 627, 637, 647, 717, 727, 737, 747 including the fluorescent material may improve optical recognition during the wafer fabrication process. As a result, the yield of fabricating the semiconductor device 1A, 1B, 1C, 1D may be improved. In addition, the decoupling units 121, 221, 321, 421 may reduce parasitic capacitance of the plurality of conductive features 130, 230, 330, 430.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a first tier structure positioned on a substrate and comprising:
 a first dielectric layer positioned on the substrate;
 a plurality of conductive features of the first tier structure positioned over the substrate and formed in the first dielectric layer; and
 a decoupling unit of the first tier structure positioned between two of the plurality of conductive features of the first tier structure and formed in the first dielectric layer, wherein the decoupling unit of the first tier structure comprises a porous dielectric material; a first set of at least one solid alignment mark comprising:
 a first-tier-alignment mark of the first set of at least one solid alignment mark positioned on the decoupling unit and between the two of the plurality of conductive features of the first tier structure, wherein the first-tier-alignment mark of the first set of at least one solid alignment mark is formed in and surrounded by the first dielectric layer, wherein a topmost surface of the first-tier-alignment mark of the first set of at least one solid alignment mark is exposed from the first dielectric layer and is higher than topmost surfaces of the plurality of conductive features and the decoupling unit;
a first set of at least one spaced alignment mark comprising:
 a first-tier-alignment mark of the first set of at least one spaced alignment mark positioned or located as a mirror image of the first-tier-alignment mark of the first set of at least one solid alignment mark with respect to a first axis of symmetry located on and parallel to a top surface of the first tier structure, wherein the first-tier-alignment mark of the first set of at least one spaced alignment mark is positioned between another two of the plurality of conductive features of the first tier structure;

wherein the first-tier-alignment mark of the first set of at least one solid alignment mark and the first-tier-alignment mark of the first set of at least one spaced alignment mark comprise a fluorescent material.

2. The semiconductor device of claim 1, wherein the fluorescent material comprises azobenzene.

3. The semiconductor device of claim 2, wherein the first-tier-alignment mark of the first set of at least one solid alignment mark is line shaped in a top-view perspective and extends along a first direction;

wherein the first axis of symmetry is at an angle with respective to the first direction of extension of the first tier-alignment mark of the first set of at least one solid alignment mark.

4. The semiconductor device of claim 3, wherein the first set of at least one solid alignment mark comprises a second-tier-alignment mark positioned above and deviated from the first-tier-alignment mark of the first set of at least one solid alignment mark, and comprising azobenzene.

5. The semiconductor device of claim 4, wherein the second-tier-alignment mark of the first set of at least one solid alignment mark is line shaped, extending along the first direction, and separated from the first-tier-alignment mark of the first set of at least one solid alignment mark along a second direction perpendicular to the first direction.

6. The semiconductor device of claim 5, wherein a length of the first-tier-alignment mark of the first set of at least one solid alignment mark and a length of the second-tier-alignment mark of the first set of at least one solid alignment mark are the same.

7. The semiconductor device of claim 6, wherein a width of the first-tier-alignment mark of the first set of at least one solid alignment mark and a width of the second-tier-alignment mark of the first set of at least one solid alignment mark are the same.

8. The semiconductor device of claim 7, wherein the width of the first-tier-alignment mark of the first set of at least one solid alignment mark is different from a distance between the first-tier-alignment mark of the first set of at least one solid alignment mark and the second-tier-alignment mark of the first set of at least one solid alignment mark.

9. The semiconductor device of claim 8, wherein the first tier structure comprises:
a second dielectric layer positioned on the first dielectric layer;
a middle dielectric layer positioned on the second dielectric layer;
a third dielectric layer positioned on the middle dielectric layer; and
a fourth dielectric layer positioned on the third dielectric layer;
wherein the decoupling unit of the first tier structure is positioned in the middle dielectric layer and on the second dielectric layer;
wherein the first-tier-alignment mark of the first set of at least one solid alignment mark is positioned along the fourth dielectric layer and the third dielectric layer, extending to the middle dielectric layer, and on the decoupling unit of the first tier structure.

10. The semiconductor device of claim 9, wherein the first dielectric layer and the third dielectric layer comprise the same material.

11. The semiconductor device of claim 10, wherein the second dielectric layer and the fourth dielectric layer comprise the same material.

12. The semiconductor device of claim 11, wherein the plurality of conductive features of the first tier structure respectively comprises:
a bottom barrier layer positioned on the second dielectric layer;
a middle conductive layer positioned on the bottom barrier layer;
a top barrier layer positioned on the middle conductive layer; and
a spacer barrier positioned on sidewalls of the bottom barrier layer, the middle conductive layer, and the top barrier layer.

* * * * *